United States Patent
Lee et al.

(10) Patent No.: US 9,907,193 B2
(45) Date of Patent: Feb. 27, 2018

(54) ELECTRONIC DEVICE INCLUDING GLASS COVER AND METHODS FOR FABRICATING SAME

(71) Applicant: Samsung Electronics Co., Ltd., Gyeonggi-do (KR)

(72) Inventors: Ha Lim Lee, Seoul (KR); Myung Gon Kim, Gyeonggi-do (KR); Jung Hyun Kim, Gyeonggi-do (KR); Soon Ho Han, Gyeonggi-do (KR); Tae Kon Kim, Gyeonggi-do (KR); Hyun Suk Shin, Gyeonggi-do (KR); Seo Hyun Kim, Gyeonggi-do (KR); Kun Chan Seo, Gyeonggi-do (KR); Seung Hoon Lee, Seoul (KR); Jong Chul Choi, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/200,122

(22) Filed: Jul. 1, 2016

(65) Prior Publication Data
US 2017/0013731 A1    Jan. 12, 2017

(30) Foreign Application Priority Data

Jul. 6, 2015    (KR) .................. 10-2015-0095858
Jan. 8, 2016    (KR) .................. 10-2016-0002838
May 23, 2016   (KR) .................. 10-2016-0062986

(51) Int. Cl.
*H04M 1/18*    (2006.01)
*H05K 5/02*    (2006.01)
(Continued)

(52) U.S. Cl.
CPC ........ *H05K 5/0217* (2013.01); *H04B 1/3888* (2013.01); *H04M 1/0266* (2013.01);
(Continued)

(58) Field of Classification Search
CPC ...... H05K 5/0217; H05K 5/0017; H05K 5/03; H04B 1/3888; G02B 1/14; H04M 1/185;
(Continued)

(56) References Cited

U.S. PATENT DOCUMENTS 7,471,509 B1 * 12/2008 Oliver ................. G11B 25/043
                                                      312/223.2
8,724,297 B2    5/2014 Tho
(Continued)

FOREIGN PATENT DOCUMENTS

EP    2 381 654 A1    10/2011
EP    2 709 283 A1     3/2014
(Continued)

OTHER PUBLICATIONS

European Search Report dated Oct. 19, 2016.
International Search Report dated Oct. 20, 2016.

*Primary Examiner* — Dimary Lopez Cruz
*Assistant Examiner* — Abhishek Rathod
(74) *Attorney, Agent, or Firm* — Cha & Reiter, LLC.

(57) ABSTRACT

Disclosed is an electronic device including a housing with a first surface facing a first direction and a second surface facing a second, opposite direction. A glass cover may form at least a portion of the first surface. A display may be exposed through the glass cover. At least one protrusion is configured to absorb external impact to the electronic device. The protrusion protrudes from the first surface and is formed as part of the glass cover or protrudes through a hole in the glass cover.

9 Claims, 32 Drawing Sheets

(51) Int. Cl.
*H04M 1/02* (2006.01)
*H04B 1/3888* (2015.01)
*H05K 5/00* (2006.01)
*H05K 5/03* (2006.01)

(52) U.S. Cl.
CPC .......... *H04M 1/185* (2013.01); *H05K 5/0017* (2013.01); *H05K 5/03* (2013.01)

(58) Field of Classification Search
CPC .. H04M 1/0266; G06F 1/1637; G06F 1/1607; C09J 7/02; B32B 7/00
See application file for complete search history.

(56) References Cited

U.S. PATENT DOCUMENTS

| | | | |
|---|---|---|---|
| 8,937,804 B2* | 1/2015 | Tanaka | H05K 5/0017 361/679.21 |
| 9,231,640 B2 | 1/2016 | Yoon et al. | |
| 9,342,105 B2 | 5/2016 | Choi et al. | |
| 2011/0261513 A1 | 10/2011 | Tho | |
| 2012/0105335 A1* | 5/2012 | Suddreth | G06F 1/1601 345/173 |
| 2014/0080552 A1 | 3/2014 | Yoon et al. | |
| 2015/0169089 A1* | 6/2015 | Dixon | H04B 1/3888 428/137 |
| 2015/0331451 A1* | 11/2015 | Shin | G06F 3/041 345/173 |
| 2016/0066440 A1 | 3/2016 | Choi et al. | |

FOREIGN PATENT DOCUMENTS

| | | |
|---|---|---|
| KR | 10-2011-0117747 A | 10/2011 |
| KR | 10-2012-0126767 A | 11/2012 |
| KR | 10-2013-0085218 A | 7/2013 |
| KR | 10-2015-0057708 A | 5/2015 |
| KR | 10-1516766 B1 | 5/2015 |

* cited by examiner

ELECTRONIC DEVICE INCLUDING GLASS COVER AND METHODS FOR FABRICATING SAME

CLAIM OF PRIORITY

This application claims the benefit under 35 U.S.C. § 119(a) of Korean patent applications filed on Jul. 6, 2015, Jan. 8, 2016, and May 23, 2016 in the Korean Intellectual Property Office and assigned Serial numbers 10-2015-0095858, 10-2016-0002838, and 10-2016-0062986, the entire disclosures of which are hereby incorporated by reference.

TECHNICAL FIELD

The present disclosure relates to a structure and fabrication of a portable electronic device having a glass cover.

BACKGROUND

Portable electronic devices such as smartphones and tablets may be implemented through various materials. In recent years, tempered glass has been mainly used on the exterior of electronic devices, e.g., to form a glass cover over a display on the front surface of the device. Further, the rear surfaces as well as the front surfaces of devices have been increasingly finished through separate tempered glass.

Some conventional electronic devices prevent a glass cover from directly receiving an external impact by surrounding the glass cover with a housing that is thicker than the glass cover. Thus when viewed from the front of the device, the glass cover is recessed from a peripheral region of the housing. In this manner, if the device is dropped and the front surface hits the ground, impact usually occurs at the housing periphery rather than the glass.

Electronic devices with curved displays have been recently introduced in the marketplace. Also, electronic devices have been developed with an "expanded" display, in which a main display region is provided at a main front side of the device and an auxiliary display region is provided on left and right lateral sides of the device. As the display is expanded or curved, the glass cover that covers the display is also expanded or curved. Such electronic devices may be more vulnerable to an external impact than a flat type, and may be further vulnerable to an external impact due to a curved form between a flat area and a curved area.

SUMMARY

Aspects of the present disclosure are to address at least the above-mentioned problems and/or disadvantages and to provide at least the advantages described below. Accordingly, an aspect of the present disclosure is to provide various structures that may prevent a glass cover from being broken.

In accordance with an aspect of the present disclosure, there is provided an electronic device with a first surface facing a first direction and a second surface facing a second, opposite direction. A glass cover may form at least a portion of the first surface. A display may be exposed through the glass cover. At least one protrusion is configured to absorb external impact to the electronic device. The protrusion protrudes from the first surface and is formed as part of the glass cover or protrudes through a hole in the glass cover.

In another aspect, an electronic device includes a display, a housing frame on which the display is mounted, and a glass cover covering the display and mounted on the housing frame. The glass cover includes at least one impact absorber attached on a surface thereof. The impact absorber covers a region of the glass cover coinciding with the display or at least a portion of a peripheral area of the glass cover adjacent to the display.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1A:
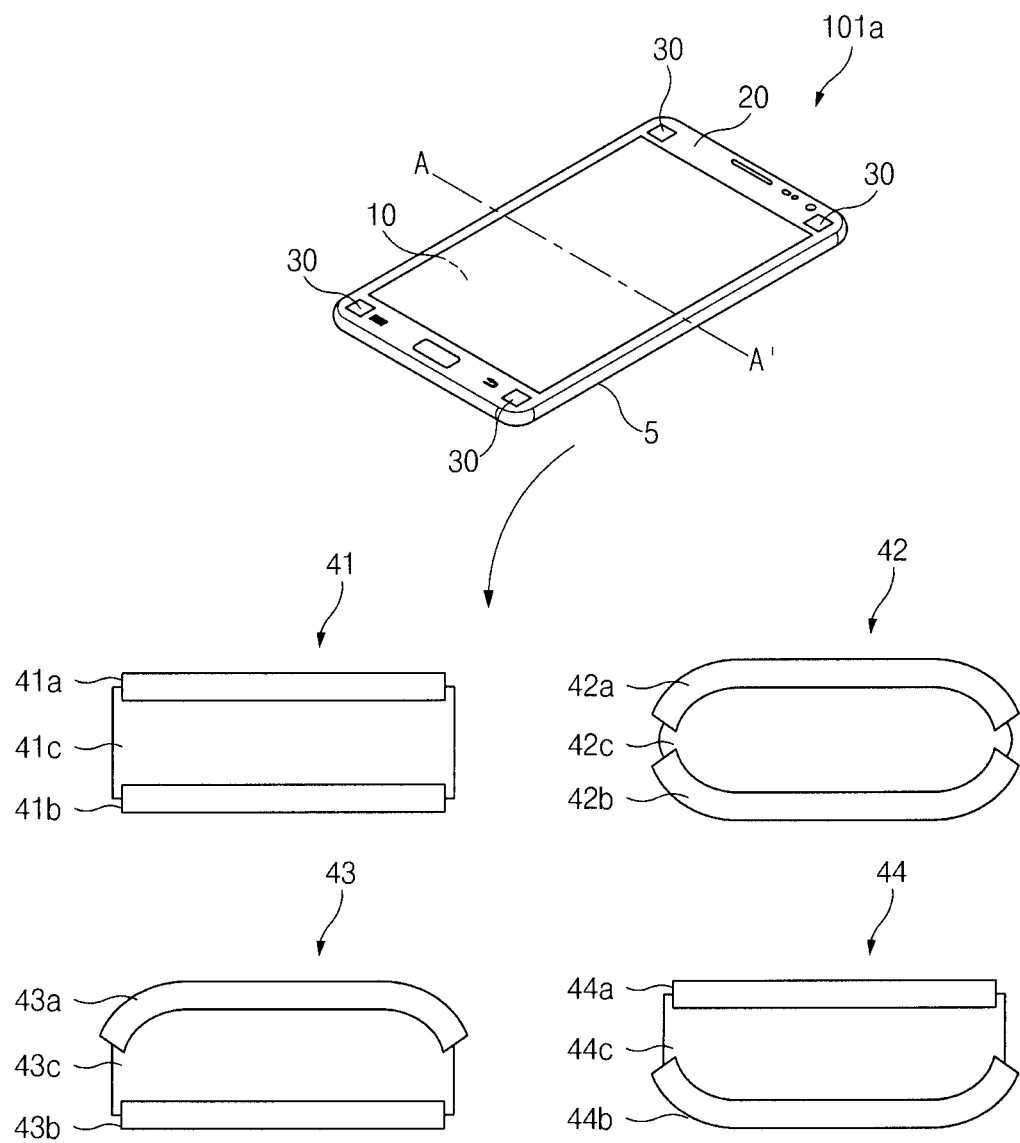
FIG. 1A illustrates a perspective view of an electronic device and examples of sectional views thereof along the lines A-A', according to various embodiments.

Hereinafter, various embodiments of the present disclosure will be described with reference to the accompanying drawings. Accordingly, those of ordinary skill in the art will recognize that modification, equivalent, and/or alternative on the various embodiments described herein can be variously made without departing from the scope and spirit of the present disclosure. With regard to description of drawings, similar components may be marked by similar reference numerals.

In the disclosure disclosed herein, the expressions "have", "may have", "include" and "comprise", or "may include" and "may comprise" used herein indicate existence of corresponding features (for example, elements such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

Terms, such as "first", "second", and the like used herein may refer to various elements of various embodiments of the present disclosure, but do not limit the elements. For example, such terms are used only to distinguish an element from another element and do not limit the order and/or priority of the elements. For example, a first user device and a second user device may represent different user devices irrespective of sequence or importance. For example, without departing the scope of the present disclosure, a first element may be referred to as a second element, and similarly, a second element may be referred to as a first element.

Herein, the term "substantially" used in describing embodiments of the present disclosure, and in the appended claims, may signify "almost", "approximately" or "nearly" in reference to refer to a dimension, characteristic, parameter, value, etc.

It will be understood that when an element (for example, a first element) is referred to as being "(operatively or communicatively) coupled with/to" or "connected to" another element (for example, a second element), it can be directly coupled with/to or connected to the other element or an intervening element (for example, a third element) may be present. In contrast, when an element (for example, a first element) is referred to as being "directly coupled with/to" or "directly connected to" another element (for example, a second element), it should be understood that there are no intervening element (for example, a third element). According to the situation, the expression "configured to" used herein may be used as, for example, the expression "suitable for", "having the capacity to", "designed to", "adapted to", "made to", or "capable of". The term "configured to (or set to)" must not mean only "specifically designed to" in hardware. Instead, the expression "a device configured to" may mean that the device is "capable of" operating together with another device or other components. CPU, for example, a "processor configured to (or set to) perform A, B, and C" may mean a dedicated processor (for example, an embedded processor) for performing a corresponding operation or a generic-purpose processor (for example, a central processing unit (CPU) or an application processor) which may perform corresponding operations by executing one or more software programs which are stored in a memory device.

Terms used in this specification are used to describe specified embodiments of the present disclosure and are not intended to limit the scope of the present disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal manner unless expressly so defined herein in various embodiments of the present disclosure. In some cases, even if terms are defined in the specification, they may not be interpreted to exclude embodiments of the present disclosure.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), MP3 players, mobile medical devices, cameras, and wearable devices. According to various embodiments of the present disclosure, the wearable devices may include accessories (for example, watches, rings, bracelets, ankle bracelets, glasses, contact lenses, or head-mounted devices (HMDs)), cloth-integrated types (for example, electronic clothes), body-attached types (for example, skin pads or tattoos), or implantable types (for example, implantable circuits).

In some embodiments of the present disclosure, the electronic device may be one of home appliances. The home appliances may include, for example, at least one of a digital video disk (DVD) player, an audio, a refrigerator, an air conditioner, a cleaner, an oven, a microwave oven, a washing machine, an air cleaner, a set-top box, a home automation control panel, a security control panel, a TV box (for example, Samsung HomeSync™, Apple TV™, or Google TV™), a game console (for example, Xbox™ or PlayStation™), an electronic dictionary, an electronic key, a camcorder, or an electronic panel.

In another embodiment of the present disclosure, the electronic device may include at least one of various medical devices (for example, various portable medical measurement devices (a blood glucose meter, a heart rate measuring device, a blood pressure measuring device, and a body temperature measuring device), a magnetic resonance angiography (MRA), a magnetic resonance imaging (MRI) device, a computed tomography (CT) device, a photographing device, and an ultrasonic device), a navigation system, a global navigation satellite system (GNSS), an event data recorder (EDR), a flight data recorder (FDR), a vehicular infotainment device, electronic devices for vessels (for example, a navigation device for vessels and a gyro compass), avionics, a security device, a vehicular head unit, an industrial or home robot, an automatic teller's machine (ATM) of a financial company, a point of sales (POS) of a store, or an internet of things (for example, a bulb, various sensors, an electricity or gas meter, a spring cooler device, a fire alarm device, a thermostat, an electric pole, a toaster, a sporting apparatus, a hot water tank, a heater, and a boiler).

According to some embodiments of the present disclosure, the electronic device may include at least one of a furniture or a part of a building/structure, an electronic board, an electronic signature receiving device, a projector, or various measurement devices (for example, a water service, electricity, gas, or electric wave measuring device). In various embodiments of the present disclosure, the electronic device may be one or a combination of the aforementioned devices. The electronic device according to some embodiments of the present disclosure may be a flexible electronic device. Further, the electronic device according to an embodiment of the present disclosure is not limited to the aforementioned devices, but may include new electronic devices produced due to the development of technologies.

Hereinafter, electronic devices according to an embodiment of the present disclosure will be described with reference to the accompanying drawings. The term "user" used herein may refer to a person who uses an electronic device or may refer to a device (for example, an artificial electronic device) that uses an electronic device.

FIG. 1A illustrates a perspective view of an electronic device, 101a, along with example sectional views thereof, according to various embodiments. Electronic device 101a may include a housing frame 5, a display 10, and a glass cover 20. The display 10 and the glass cover 20 may be mounted on the housing frame 5. The glass cover 20 may have a central region through which images from display 10 located behind glass cover 20 are emitted, and a peripheral region outside the central region, as illustrated in FIG. 1A. The glass cover 20 (which is shown as a front cover of device 101a), the housing frame 5, and a rear cover, may together form a housing of device 101a. A circuit board, various sensors, and modules may be mounted within and thereby protected by the housing. A portion of the housing frame 5 may form a portion of the exterior surface of the electronic device 101a. The rear cover may be another glass cover, as in the example sectional views of FIG. 1A, or may be composed of a different material. The rear cover may also be integral with the housing frame 5. Thus, in various embodiments, the housing frame 5 may surround all outer areas of the electronic device 101a other than an area surrounded by the glass cover 20. That is, the housing frame 5 may form one portion of the exterior surface of electronic device 101a while the glass cover forms the remaining portion of the device 101a's exterior surface.

In the example of FIG. 1A, electronic device 101a has a generally solid rectangular shape (which may also be referred to as a slate shape or bar shape), with a front side, a rear side and four lateral sides. (Corners may be rounded, as illustrated, or may alternatively have sharp right angles.) Electronic device 101a may be thin, such that the length and width of each of the front side and the rear side may be significantly larger than the device thickness. Other shapes are also possible. As illustrated, the display 10 may emit images through the front side of the electronic device 101a. The display 10 may display contents associated with various functions performed by the electronic device 101a. When the display 10 includes a touch panel, it may perform both an input function and an output function. In various embodiments, the display 10 may be divided into an active area for displaying contents and a partial area behind a black matrix (BM) area of the glass cover 20, i.e., the peripheral region of glass cover 20. The partial area of display 10 may include peripheral wiring lines of the active area and the like.

In the following description, terms such as "curved display", "flat display" or "expanded display" may be used to refer to the display 10 and the glass cover 20 collectively. For example, a "curved display" may collectively include a display component emitting images, such as the display 10 located behind the glass cover 20, in conjunction with the glass cover 20 configured with curves on the sides thereof.

Although FIG. 1A exemplarily illustrates the electronic device 101a with a flat display, the present disclosure is not limited thereto. For example, an "expanded display" may be provided so as to emit a main image from the front side of electronic device 101a as well as auxiliary images from a side (lateral) area of the electronic device 101a. In this case, the expanded display may include a flat area forming a front surface of the electronic device 101a, a curved area bent and expanded from the flat area at a curvature, and a side area.

As mentioned earlier, the glass cover 20 may form at least part of the housing of electronic device 101a. The glass cover 20 may cover and protect a peripheral area (for example, elements within the active area and the BM area) and the display 10. The glass cover 20 may be formed of tempered glass. Note that the glass cover 20 may alternatively be called a glass case or a glass housing.

The glass cover 20 may be disposed not only on the front side electronic device 101a coinciding with the display 10, but also on the rear side (thereby defining a rear surface opposite to the front surface of the electronic device 101a). Cross-sectional views 41 to 44 taken along line A-A' of the electronic device 101a illustrate respective example configurations in which the glass cover 20 may form the exterior of the electronic device 101a in various forms. In each of views 41 to 44, the shown front and rear covers may collectively be considered examples of the glass cover 20. (In these cross-sectional views, the front and rear covers are illustrated with sharp corners at the interfaces with the housing frame but they may typically be tapered at such interfaces.)

Referring to the sectional view 41, the electronic device 101a may include a front cover 41a, a rear cover 41b, and a housing frame 41c. The front cover 41a and the rear cover 41b may be implemented in flat forms. The housing frame 41c may be disposed between the front cover 41a and the rear cover 41b, and may mount and fix the front cover 41a and the rear cover 41b.

Referring to the sectional view 42, the electronic device 101a may include a front cover 42a, a rear cover 42b, and a housing frame 42c. The front cover 42a and the rear cover 41b may be implemented in curved forms having curved areas at opposite ends thereof. Each of the front cover 42a and the rear cover 42b may include a central flat area and curved areas on opposite ends, bent to extend from the flat area.

When the front cover 42a and the rear cover 42b are implemented in curved forms, this may facilitate gripping of the electronic device 101a by the user. Further, the lateral side area of the electronic device 101a may be used for outputting contents and receiving a touch input. A housing frame 42c may be disposed between the front cover 42a and the rear cover 42b, and may mount and fix the front cover 42a and the rear cover 42b.

In sectional view 43, a housing frame 43c is disposed between and fixes a curved front cover 43a and a flat rear cover 43b. In sectional view 44, a flat front cover 44a, a housing frame 44c and a curved rear cover 44b are employed. According to design needs, various forms of glass covers 20 may be used.

Hereinafter, it will be mainly discussed that the glass cover 20 is disposed on a front side of electronic device 101a and is implemented in a flat form or a curved form, but the present disclosure is not limited thereto.

According to various embodiments, the glass cover 20 may include one or more protrusions 30. The protrusions 30 may be disposed on a surface of the glass cover 20. Although FIG. 1A exemplarily illustrates that the protrusions 30 are disposed on a front surface of the electronic device 101a, the present disclosure is not limited thereto. For example, when the protrusions 30 are disposed on a rear surface of the electronic device 101a, they may be separately disposed on a surface of the rear cover 41b, 42b, 43b, or 44b. Additional details on example forms and functions of the protrusions 30 are provided through FIG. 1B.

Figure 1B:
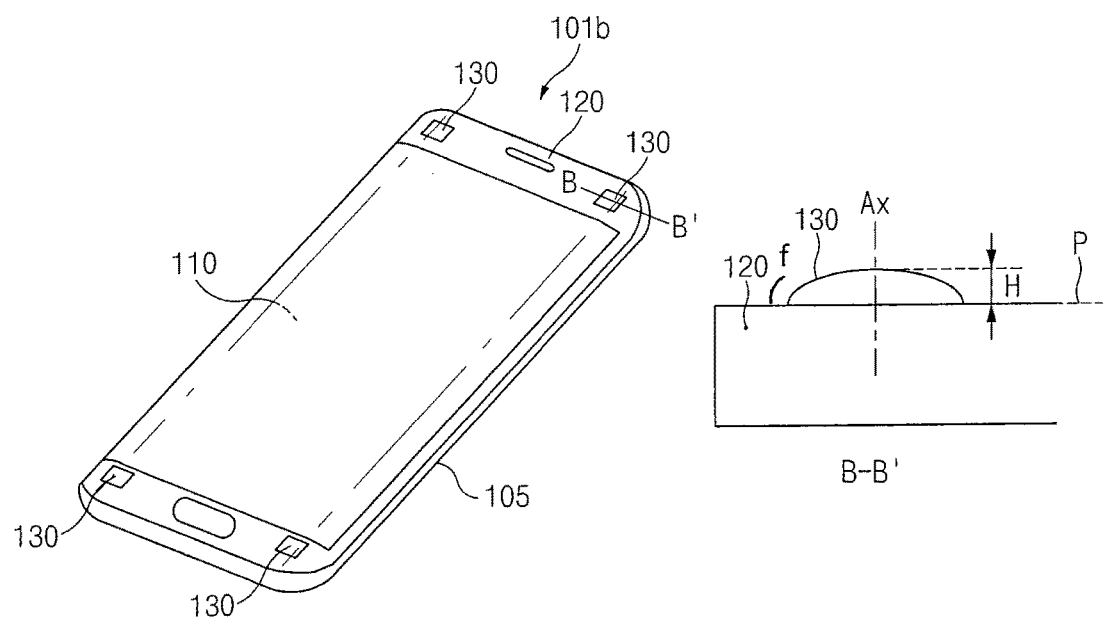
FIG. 1B illustrates a perspective view of an electronic device and a sectional view of a protrusion on a surface thereof, according to various embodiments.

FIG. 1B illustrates a perspective view of an electronic device and a cross-sectional view of a protrusion according to various embodiments. Electronic device 101b may include a housing frame 105, a display 110, and a glass cover 120. The operations or functions of housing frame 105 and display 110 may be the same or similar to the operations or functions of the housing frame 5 and display 10 of FIG. 1A.

Although FIG. 1B exemplarily illustrates that the glass cover 120 is disposed on the front side of device 101b, another part of glass cover 120 may be disposed on the rear side (as in the sectional examples 41-44 of FIG. 1A). The glass cover 120 may include one or more protrusions 130. The protrusions 130 may be disposed at points of a surface of the glass cover 120, the points being proximate or adjacent to the housing frame 105. The protrusions 130 may be disposed in areas (for example, a bezel area) that do not overlap an active area of the display 110 (note that the active area can also be called a view area or image output area).

As seen in the cross-sectional view taken along the lines B-B', protrusions 130 may protrude from surrounding regions of glass cover 120, i.e., protrude outwardly on the front side of electronic device 101b. When an external impact is applied to the electronic device 101b (for example, when the electronic device 101b drops on the front side or the rear side), the protrusions 130 may absorb an impact applied to the glass cover 120 first or receive the impact instead to prevent the glass cover 120 from being broken or scratched.

In general, a condition in which the glass cover is broken may be a case in which a local impact is applied from the outside to the glass cover (generation of a dent) or a bending load of a predetermined level or higher is applied to the glass cover. The protrusions 130 may block an origin point, to which an external impact that occurs on a surface of the glass cover 120 is applied, to prevent the glass cover 120 from being broken.

Although FIG. 1B exemplarily illustrates that the sections of the protrusions 130 can be generally semielliptical or hemispherical, the present disclosure is not limited thereto. In FIG. 1B, a protrusion 130 is approximately symmetrical about an axis Ax and extends a height H above the surrounding surface of glass cover 120. If the front surface "f" of glass cover 120 is flat along a plane P, the axis Ax of protrusion 130 may coincide with a normal to the plane P, such that the protrusion 130 may be said to face the same direction as the front surface f, i.e., the direction of the normal. If the protrusion is located on a region of the front surface which is curved, as in some of the examples below, its axis Ax may point in the same direction as a normal to the tangent plane at a central point of such region. However, even in this case, the protrusion may be generally said to face in the same or approximately the same direction as the front surface of the glass cover 120. The protrusions 130 may be formed of various materials in various manufacturing methods and may be configured with dimensions sufficient to achieve certain metrics in protecting the glass cover 120 from breakage.

According to various embodiments, the protrusions 130 may be disposed proximate or adjacent to corners of the electronic device 101b. Because a corner portion of the electronic device 101b primarily receives an external impact when the impact is applied due to a fall or the like, the protrusion 130 may be disposed adjacent to the corners of the electronic device 101b to prevent the glass cover 120 from being broken.

Further exemplary details on the protrusions 130 are provided through FIGS. 2 to 9.

Figure 2:
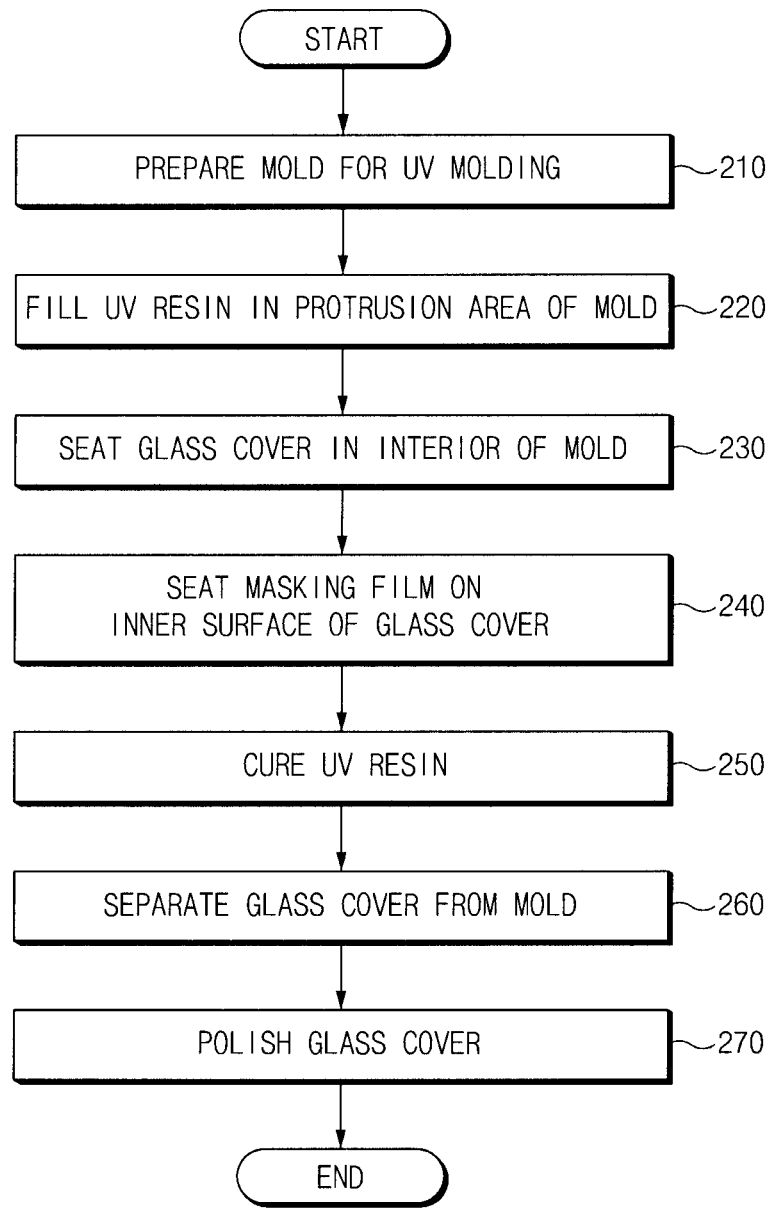
FIG. 2 is a flowchart of an example process of forming a protrusion using an ultraviolet curing resin according to various embodiments.
Figure 3:
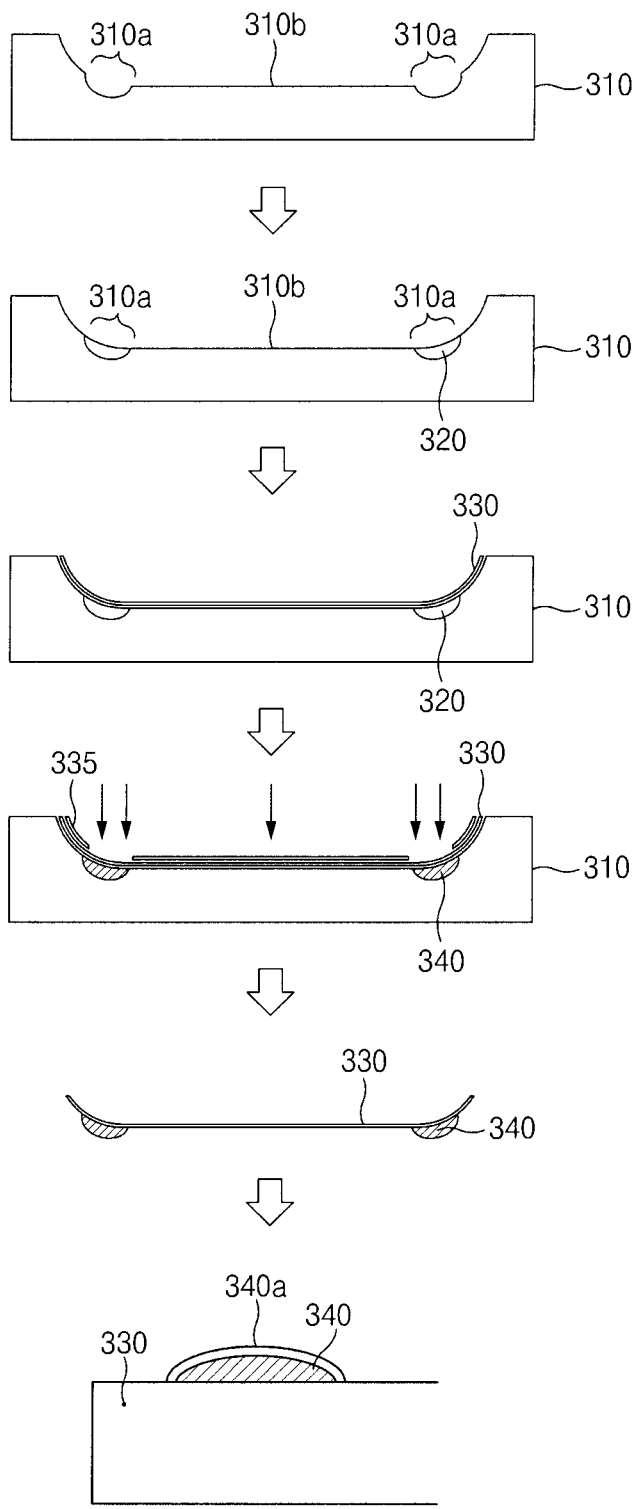
FIG. 3 is a process view illustrating example stages of the process of FIG. 2.

FIG. 2 is a flowchart of an example process of forming a protrusion using an ultraviolet curing resin according to various embodiments. FIG. 3 is a process view illustrating example stages of this process.

Referring to FIGS. 2 and 3, the protrusions may be formed of an ultraviolet curing resin. The ultraviolet curing resin may easily maintain at least a specific hardness, and the hardness may be reinforced through a separate hard coating operation. In various embodiments, the ultraviolet curing resin may have a color and a transparency that are the same or similar to those of the glass cover.

In operation 210, a mold 310 for UV molding may be prepared. The mold 310 may include protrusion areas 310a by which the protrusions 340 are formed, and a glass area 310b on which the glass cover 330 is seated. The protrusion areas 310a may be recesses formed in the interior of the mold 310.

In operation 220, a UV resin 320 may be filled in the protrusion areas 310a of the mold 310. The UV resin 320 may be applied through a dropping pipette type or other methods. The UV resin 320 may be cured by an ultraviolet ray to form the protrusions 340. In various embodiments, when the UV resin 320 is cured, a high hardness material having a pencil hardness of 3H or higher may be obtained.

In operation 230, the glass cover 330 may be seated on the glass area 310b in the interior of the mold 310. In this example the glass cover 330 is exemplified as a curved glass cover; however, the process is equally applicable to a glass cover which is entirely flat (with the mold 310 being designed to correspond to the glass cover shape accordingly).

In operation 240, a masking film 335 may be seated on an inner surface of the glass cover 330. The masking film 335 is printed on the remaining areas of the inner surface of the glass cover 330 other than the protrusion areas 310a to block an ultraviolet ray from passing through the remaining areas of the mold 310. In various embodiments, the masking film 335 may be maintained to have a specific thickness or less. The masking film 335 may be attached to the glass cover 330 by using 1) a method of positioning the mold 310 in a sealed chamber and pulling the mold 310 through suctioning, and 2) a method of pressing the mold 310 by using a pad or a roller.

In operation 250, an ultraviolet ray may be irradiated to the interior of the mold 310, and the UV resin 320 may be cured. In the ultraviolet ray irradiating process, mercury, metal, and a UV lamp may be used. The ultraviolet ray may be blocked in an area in which the masking film 335 is seated, and may pass through the protrusion areas 310a that are not blocked by the masking film 335. An ultraviolet ray is irradiated to the UV resin 320 filled in the protrusion areas 310a, the UV resin 320 may be cured to form the protrusions 340.

In operation 260, the mold 310 may be separated from the glass cover 330 (including the protrusions 340). The masking film 335 also may be separated from the glass cover 330.

In operation 270, the glass cover 330 may be polished by using an alcohol based cleaning liquid (methyl alcohol or ethyl alcohol), ultrasonic waves, dipping, or other water washing methods.

According to various embodiments, the protrusions 340 may be processed through hard coating. The hard coating film 340a may be formed by using SiO2 or acryl urethane based anti-scratch hard coating or AF coating.

According to various embodiments, the ultraviolet curing resin may be cured through thermosetting, in addition to through UV curing, to increase a joining force of the glass cover 330. Further, a surface of the glass cover 330 may be processed by plasma before being attached, to increase a joining force between the ultraviolet curing resin and the glass cover 330.

According to various embodiments, the ultraviolet curing resin may be directly molded on a surface of the glass cover 330 (glass direct molding: GDM), or a polymeric film may be disposed between the ultraviolet curing resin and the glass cover 330. The polymeric film may be any one of poly ethylene terephthalate (PET), poly methyl methacrylate (PMMA), and poly carbonate (PC).

Figure 4:
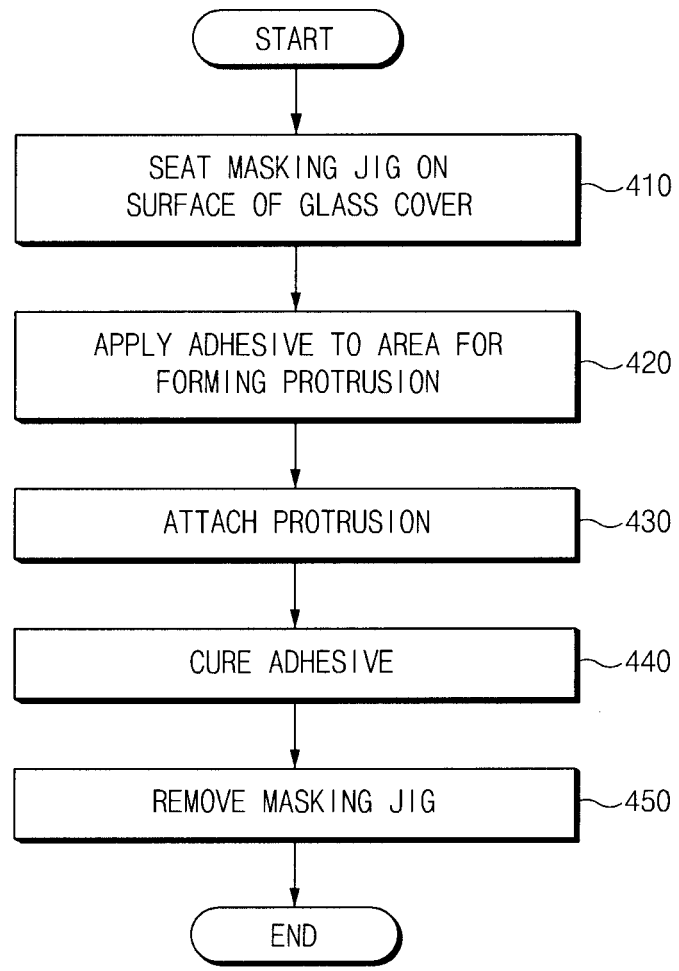
FIG. 4 is a flowchart of an example process for forming a protrusion by using a material different from that of a glass cover according to various embodiments.
Figure 5:
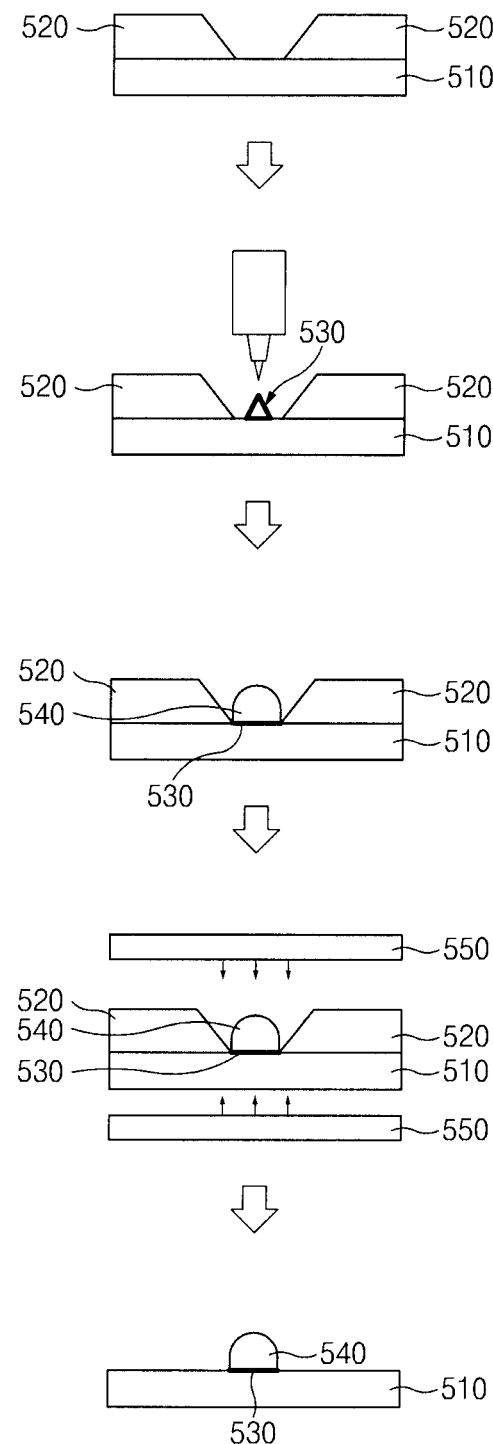
FIG. 5 is an example process view illustrating stages of the process outlined in FIG. 4.

FIG. 4 is a flowchart of an exemplary process of forming a protrusion by using a material different from that of a glass cover according to various embodiments. FIG. 5 is a process view illustrating example stages of this process.

Referring to FIGS. 4 and 5, the protrusions 540 may be formed of glass that is the same material as that of the glass cover, or may be formed of a material, such as ceramic or sapphire, which is different from that of the glass cover. For example, the protrusions may be formed of a ceramic material. The ceramic based material such as sapphire may have a surface hardness or a strength that are higher than those of glass, and in particular, because the protrusion shapes may be stubby (with a height H smaller than its base dimension), they may have a high durability against damage due to bending after being dented.

In operation 410, a masking jig 520 may be seated on a surface of the glass cover 510. The positioning of the masking jig 520 may determine locations at which the protrusions 540 are attached, and may prevent the protrusions 540 from being separated, in the bonding operation.

In operation 420, an adhesive 530 may be applied to areas on which the protrusions 540 are seated. The adhesive 530 may be a thermosetting adhesive, a pressure reducing adhesive, or an ultraviolet joining adhesive. The adhesive 530 may be introduced on the masking jig 520 through various methods such as a dropping pipette type. In operation 430, the protrusions 540 may be seated in recesses of the masking jig 520, to which the adhesive 530 is applied. The protrusions 540 may be a transparent material such as sapphire or ceramic. By configuring the protrusions 540 with a stubby profile, it may be more advantageous in damage resistance.

In operation 440, the adhesive 530 may be cured in the interior of a curing unit 550 by using heat, high pressure, or ultraviolet rays. As the adhesive 530 is cured, a bonding force between the protrusions 540 and the glass cover 510 may be reinforced. The curing unit 550 may output heat, pressure, or ultraviolet rays from the outside to the interior of the masking jig 520 according to the type of the adhesive 530. In operation 450, the masking jig 520 may be removed, and the glass cover 510 to which the protrusions 540 are attached may be formed.

Figure 6:
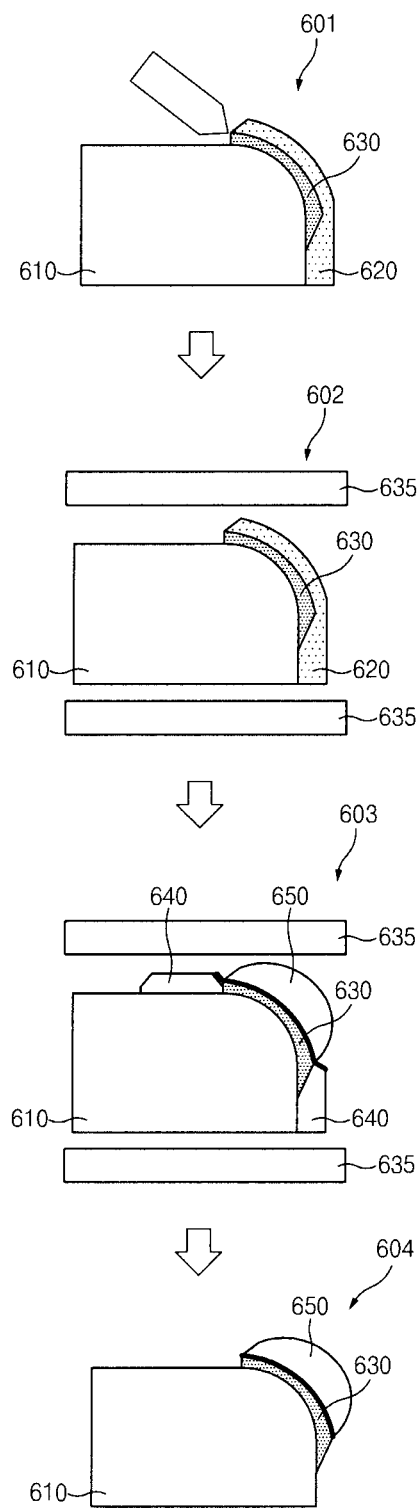
FIG. 6 is an exemplary process view illustrating a process of forming a protrusion in a curved area according to various embodiments.

FIG. 6 is an exemplary process view illustrating a process of forming a protrusion in a curved area according to various embodiments. In this process, when protrusions 650 are formed on corners of a glass cover 610 having a curved form, the curvature of bonding surfaces may be primarily attenuated by using a curing resin and the protrusions 650 may be attached to the surface formed through the curing resin. In this case, shaking due to a difference of curvature may be reduced as compared with the case in which the protrusions 650 are directly attached to the glass cover 610.

In operation 601, a curing agent jig 620 may be attached to the glass cover 610. The curing agent jig 620 may be attached to a side surface of the glass cover 610 such that a space for inserting a curing agent 630 may be formed in the curved area. The curing agent 630 may be injected into the space.

In operation 602, the curing agent 630 may be primarily dried into a semi-cured state, by primarily irradiating heat or an ultraviolet ray by a curing apparatus 635.

In operation 603, a curing agent jig 620 may be removed, and a masking jig 640 may be attached. The masking jig 640 may be attached to opposite surfaces of the curing agent 630, or may fix the protrusions 650 in the bonding operation. Thereafter, the protrusions 650 may be bonded to the curing agent 630, and additionally, the curing agent 630 may be completely cured by additionally applying heat or an ultraviolet ray.

In operation 604, after the curing agent 630 is completely cured, the masking jig 640 may be removed. The protrusions 650 may be seated on the curved surface of the glass cover 610.

Figure 7:
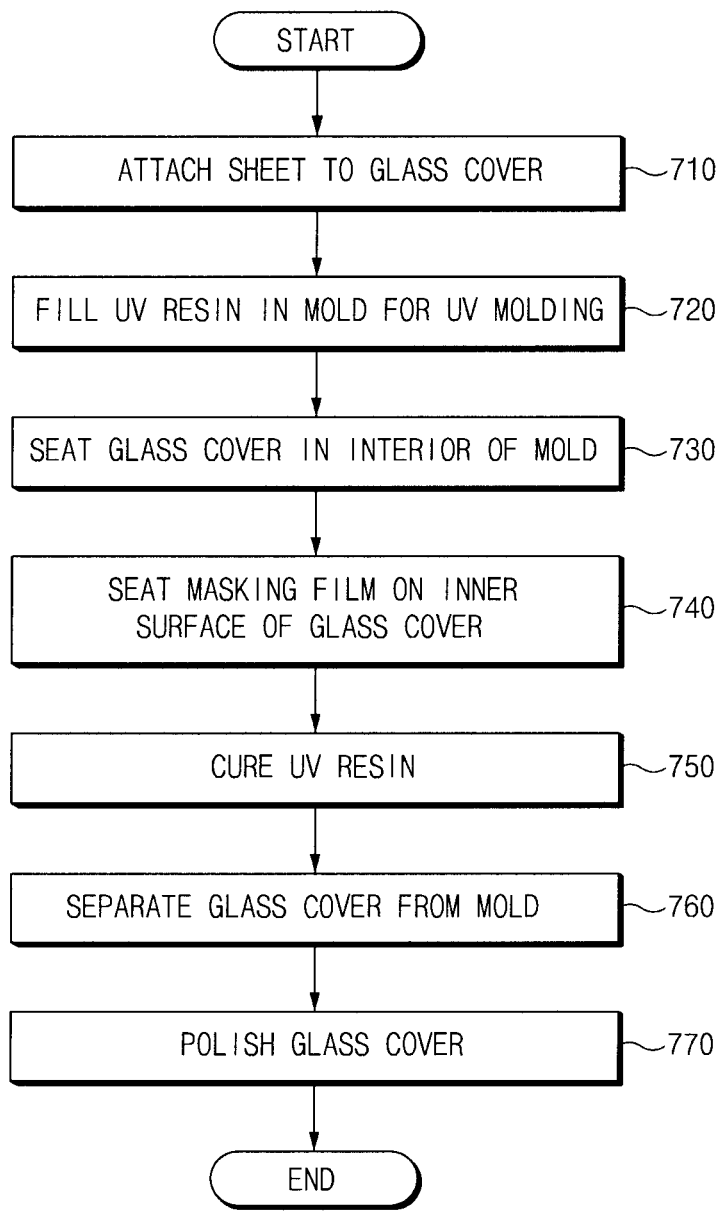
FIG. 7 is a flowchart of an example process of forming a protrusion by using a sheet and UV molding according to various embodiments.
Figure 8:
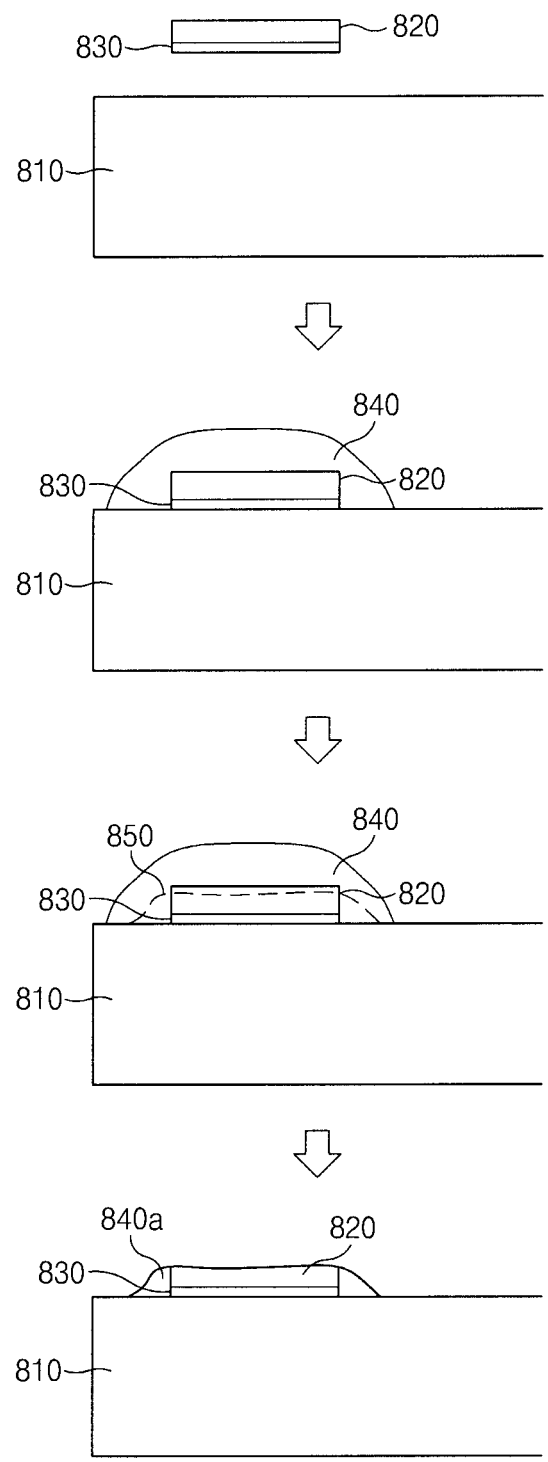
FIG. 8 is an example process view illustrating stages of the process outlined in FIG. 7.

FIG. 7 is a flowchart of an example process for a forming a protrusion by using a sheet and UV molding according to various embodiments. FIG. 8 is a process view showing example stages of this process.

Referring to FIGS. 7 and 8, the protrusion may be formed through a sheet 820 attached on a surface of a glass plate 810 and a UV molding part 840 around the sheet 820. In operation 710, the sheet 820 may be attached to a surface of the glass cover 810 through a bonding layer 830. The sheet 820 may be an impact absorbing film such as transparent PET or TPU.

In operation 720, a mold for UV molding may be prepared around the sheet 820, and a UV resin may be filled in the protrusion area of the mold. The UV resin may be applied through a dropping pipette type or other methods.

In operation 730, the glass cover 810 may be seated in the interior of the mold.

In operation 740, a masking film may be seated on an inner surface of the glass cover 810. The masking film may be printed in remaining areas of the glass cover 810 other than the protrusion area, and may block an ultraviolet ray from passing through the remaining areas of the glass cover 810.

In operation 750, an ultraviolet ray may be irradiated to the interior of the mold, and the UV resin may be cured. As the UV resin is cured, the sheet 820 and the UV molding part 840 that covers a peripheral area of the sheet 820 may be formed. In operation 760, the mold and the glass cover 810 may be separated from each other. In this case, the sheet 820 is covered by the UV molding part 840 and may not be exposed to the outside.

In operation 770, the glass cover 810 may be polished. In this case, the UV molding part 840 may be removed up to a specific line 850. As the UV molding part 840 is removed, an upper end of the sheet 820 may be exposed and a UV molding part 840a may be left in a peripheral area of the sheet 820. Through this, a step that is formed as the sheet 820 is attached to a surface of the glass cover 810 may be changed into a soft surface through the UV molding part 840a. Through the UV molding part 840a, the protrusion may be smoothed and thereby prevented from being caught by a hand or the clothes of the user.

Figure 9A:
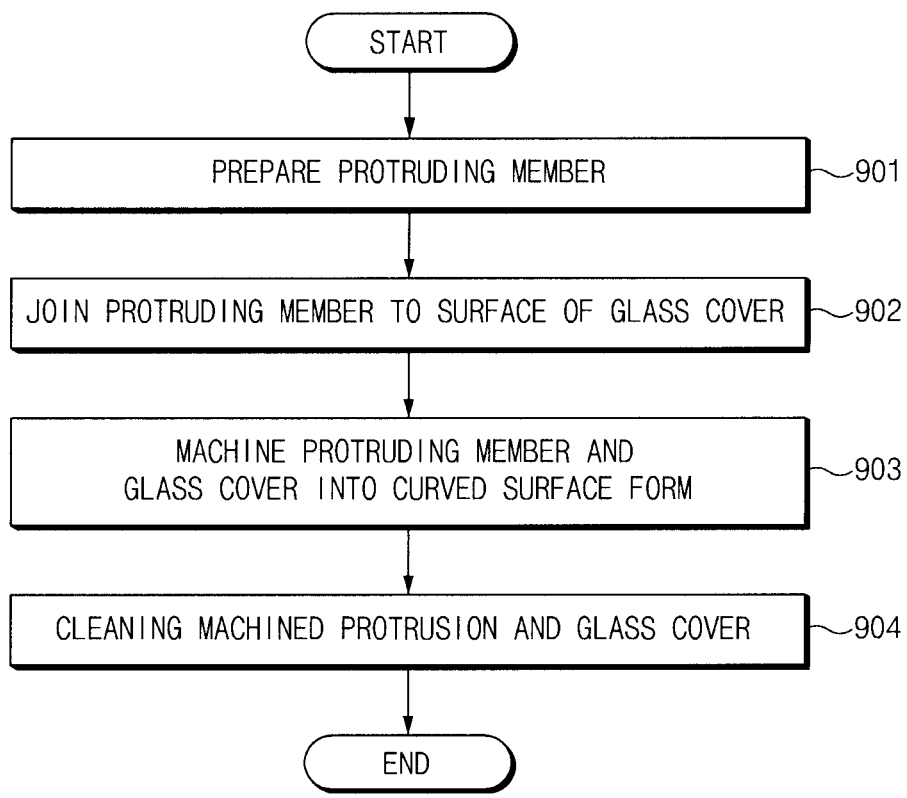
FIG. 9A is a flowchart of an example process of attaching a protrusion through surface machining according to various embodiments.
Figure 9B:
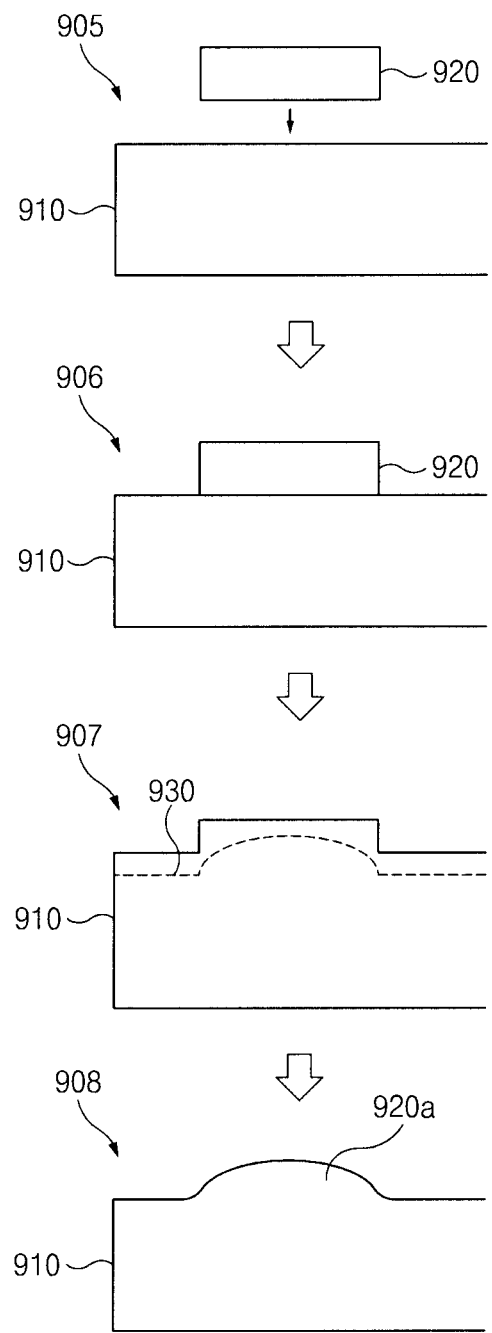
FIG. 9B is an example process view illustrating stages of the process outlined in FIG. 9A.

FIG. 9A is a flowchart of a process of attaching a protrusion through surface machining according to various embodiments. FIG. 9B is a process view showing example stages in this process.

Referring to FIGS. 9A and 9B, a protrusion may be attached to a surface of a glass cover by machining the glass cover without using a separate adhesive.

In operation 901, a protruding member 920 may be prepared. The protruding member 920 may be formed of glass that is the same material as that of the glass cover 910, or may be formed of a material, such as ceramic or sapphire, which is different from that of the glass cover 910 (operation 905 of FIG. 9B).

In operation 902, the protruding member 920 may be disposed to contact a surface of the glass cover 910. Thereafter, the protruding member 920 may be joined to the glass cover 910 by using a fusing tool (for example, a heated press) (operation 906 of FIG. 9B).

In operation 903, the protruding member 920 and the surface of the glass cover 910 may be machined into a form of a soft curved surface 930 by using a polishing tool. The polishing tool may use a surface machining method, for example, using a machining tool or a grinding tool (operation 907 of FIG. 9B).

In operation 904, a portion of the upper end surface of the glass cover 910 may be removed, and the protruding member 920 may be changed into a protrusion 920a in a smoothly curved form. According to various embodiments, the surfaces of the glass cover 910 and the protrusion 920a may be coated by anti-fingerprint (AF) or anti-reflection (AR) through a separate post-machining process (operation 908 of FIG. 9B).

Figure 9C:
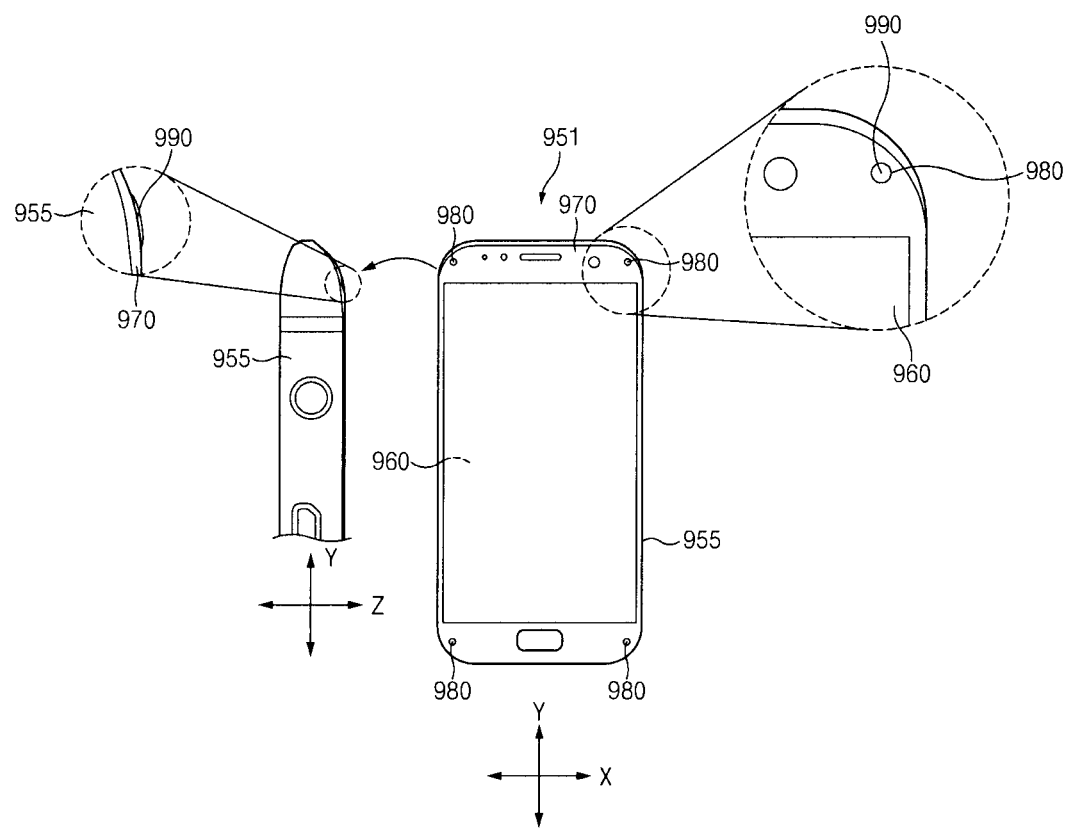
FIG. 9C illustrates an electronic device in which a protrusion is formed by using a hole formed in a glass cover according to various embodiments.

FIG. 9C illustrates an electronic device in which a protrusion is formed by using a hole formed in a glass cover according to various embodiments. Electronic device 951 may include a housing frame 955, a display 960, and a glass cover 970. The functions or forms of the housing frame 955 and the display 960 may be the same or similar to the functions or forms of the housing frame 5 or 105 and the display 10 or 110 of FIGS. 1A and 1B.

The glass cover 970 may form at least a portion of the exterior surface of the electronic device 951. In various embodiments, the glass cover 970 may cover and protect the front side of the electronic device 951, including the display 960.

In various embodiments, the glass cover 970 may include a curved area at at least a portion thereof. For example, the glass cover 970 may be flat in a central area coinciding with the display 960 (hereinafter, a "display view area" or "active area") that transmits light output by display 960, and may have a convex curved surface in a bezel area around display 960.

According to various embodiments, the glass cover 970 may include one or more holes 980. FIG. 9C illustrates that the holes 980 are circular, but the present disclosure is not limited thereto. For example the holes 980 may alternatively have a polygonal shape such as a pentagonal shape or a hexagonal shape.

In various embodiments, the holes 980 may be disposed in peripheral areas of the glass cover 970, which are areas adjacent to the housing frame 955. One or more holes 980 may be disposed in areas of the glass cover 970 outside the display view area of the glass cover 970.

In various embodiments, the holes 980 may be formed at points that are spaced from the side housing 955 of the electronic device 951 by a specific distance (for example, 2.5 mm) or more. In various embodiments, the holes 980 may be disposed at respective corners (or points adjacent to the corners of the electronic device 951) of the rectangular glass cover 970.

In various embodiments, the protrusions 990 may be disposed in the interiors of the holes 980. The protrusions 990 may be formed of a material that is the same as or different from the glass cover 970. In various embodiments, the protrusions 990 may be implemented in a color that is the same as or different from that of the glass cover 970.

In various embodiments, the protrusions 990 may be formed as extensions of the housing frame 955. For example, interior portions of the housing frame 955 may protrude at locations corresponding to the holes 980, and the interior portions of the housing frame 955 may be exposed to the outside through the holes 980.

In various embodiments, the protrusions 990 may be formed of a separate material attached to an interior surface of the housing frame 955. For example, the protrusions 990 may be formed of a material different from that of housing frame 955, and recesses for mounting the protrusions 990 may be formed on the inner surface of the housing frame 955. As another example, the protrusions 990 may be structures (for example, rotational screws) that are inserted into the holes 980 from the outside of the electronic device 951. Further exemplary details on the form, material, and mounting type of the protrusions 990 is provided through FIG. 9D or FIG. 9E.

In various embodiments, the protrusions 990 may protrude from the outer surface of the glass cover 970. For example, the protrusions 990 may protrude from the outer surface of the glass cover 970 by 0.1 mm. When the electronic device 951 falls to the ground on its rear or front side or collides with an external object, the protrusions 990 may absorb an impact from the ground or external object first to protect the glass cover 970.

Figure 9D:
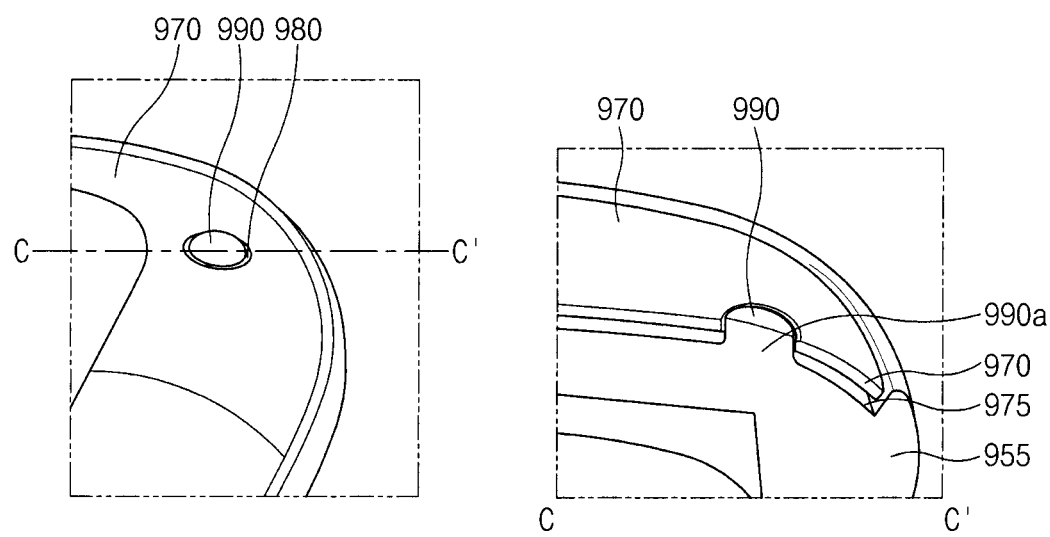
FIG. 9D and FIG. 9E illustrate a protrusion formed in the interior of a hole according to various embodiments.
Figure 9E:
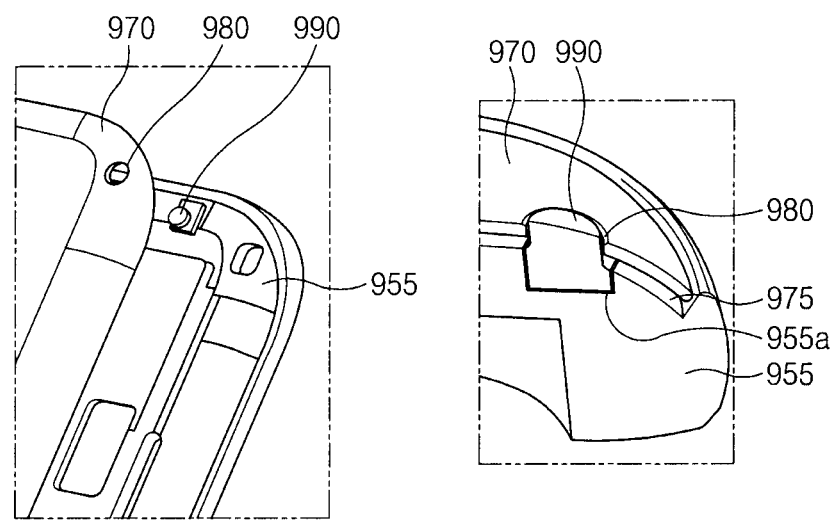

FIGS. 9D and 9E illustrate a protrusion extending from the interior of a hole of a glass cover according to various embodiments.

Referring to FIGS. 9D and 9E, the protrusions 990 may extend from the interiors of the holes 980 when the electronic device is finally assembled. The protrusions 990 may protrude from the outer surface of the glass cover 970 to receive an impact earlier than the glass cover 970. The protrusions 990 may be formed of a separate material from that of the glass cover 970. External impact applied to the protrusions 990 may be effectively absorbed by protrusions 990, while some of the impact energy may be indirectly transferred to the glass cover 970 but at a reduced level, thereby preventing breakage.

The glass cover 970 may be mounted on the housing frame 955. A bonding layer 975 may be disposed between the housing frame 955 and the glass cover 970. The bonding layer 975 may prevent from the glass cover 970 from being separated. (Enlargement view C-C' is an angled, perspective cut-away view illustrating bonding layer 975.)

As shown in FIG. 9D, the housing frame 955 may include bosses 990a for forming the protrusions 990 at a point corresponding to the locations of the holes 980. For example, when the housing frame 955 is a plastic injection molding product, it may be integrally formed with the bosses 990a through one injection molding process.

The bosses 990a may have a sectional area corresponding to that of the holes 980 (with a slightly smaller circumference to partially penetrate the holes 980). In various embodiments, the bosses 990a may have a height corresponding to the glass cover 970 and the bonding layer 975. At least portions of the bosses 990a may be exposed to the exterior through the holes 980.

According to various embodiments, separate materials may be mounted on a top surface of the bosses 990a exposed to the exterior to form "caps" on the bosses and 990a and thereby finally form the protrusions 990. For example, materials that are similar to the glass cover 970 in an aspect of external appearances may be mounted on the top surfaces of the bosses 990a.

Referring to FIG. 9E, the protrusions 990 may be formed of a material that is separate from that of the housing frame 955. The housing frame 955 may have recesses 955a for mounting the protrusions 990 on an inner surface thereof. The recesses 955a may be disposed on the inner surface of the housing frame 955 at locations corresponding to the locations of the holes 980. The protrusions 990 formed of a separate material from that of the housing frame 955 may be mounted in the recesses 955a. Lower ends of the protrusions 990 may have forms corresponding to the recesses 955a.

According to various embodiments, each of the protrusions 990 may include a first part mounted in the recess 955a and a second part coupled to the first part such that a portion thereof is exposed through the hole 980. The second part may have an appearance that is the same as or similar to that of the glass cover 970, and may protrude outwards from the exterior surface of the glass cover 970.

Figure 10:
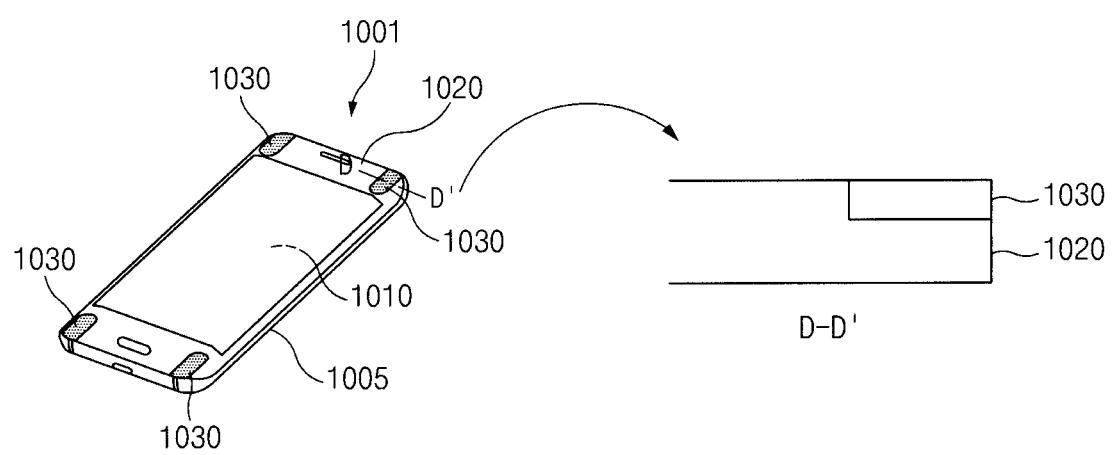
FIG. 10 illustrates a perspective view of an electronic device and a sectional view of an impact absorber according to various embodiments.

FIG. 10 illustrates a perspective view of an electronic device, 1001, and a sectional view of an impact absorber according to various embodiments. Electronic device 1001 may include a housing frame 1005, a display 1010, and a glass cover 1020. The functions or forms of the housing frame 1005 and the display 1010 may be the same or similar to the functions or forms of the housing frame 5 or 105 and the display 10 or 110 of FIGS. 1A and 1B.

According to various embodiments, the glass cover 1020 may include one or more impact absorbers 1030. The impact absorbers 1030 may be disposed in areas (for example, a bezel area) that do not overlap the display 1010 of the glass cover 1020. Unlike the protrusions 130 of FIG. 1, the impact absorbers 1030 may be formed in areas from which at least a portion of the surface of the glass cover 1020 is removed. In various embodiments, the impact absorbers 1030 may protrude at the front side of electronic deice 1001, from a surrounding exterior surface of the glass cover 1020. Alternatively, impact absorbers 1030 may be flush with the exterior surface of glass cover 1020 as seen in the cross-sectional view along lines D-D'. Similarly to the protrusions 130 of FIGS. 1A and 1B, the impact absorbers 1030 may absorb an impact applied to the glass cover 1020 first or receive most of the impact instead to prevent the glass cover 1020 from being broken when an external impact is generated, for example, when the electronic device 1001 falls on the ground. The impact absorbers 1030 may be formed of various materials in various manufacturing methods.

According to various embodiments, when the glass cover 1020 is part of an "expanded display", with portions on the left and right lateral side surfaces of the electronic device, the impact absorbers 1030 may be disposed at junctions of the flat area and the curved area of the glass cover 1020. Because the junction areas may be parts that are curved outwards or vulnerable to an impact, they may be origin points at which cracks are generated when an external impact is applied to the electronic device 1001 (for example, due to a fall). The impact absorbers 1030 may be disposed at the junction or adjacent to the junction to protect the glass cover 1020 from cracks.

Figure 11:
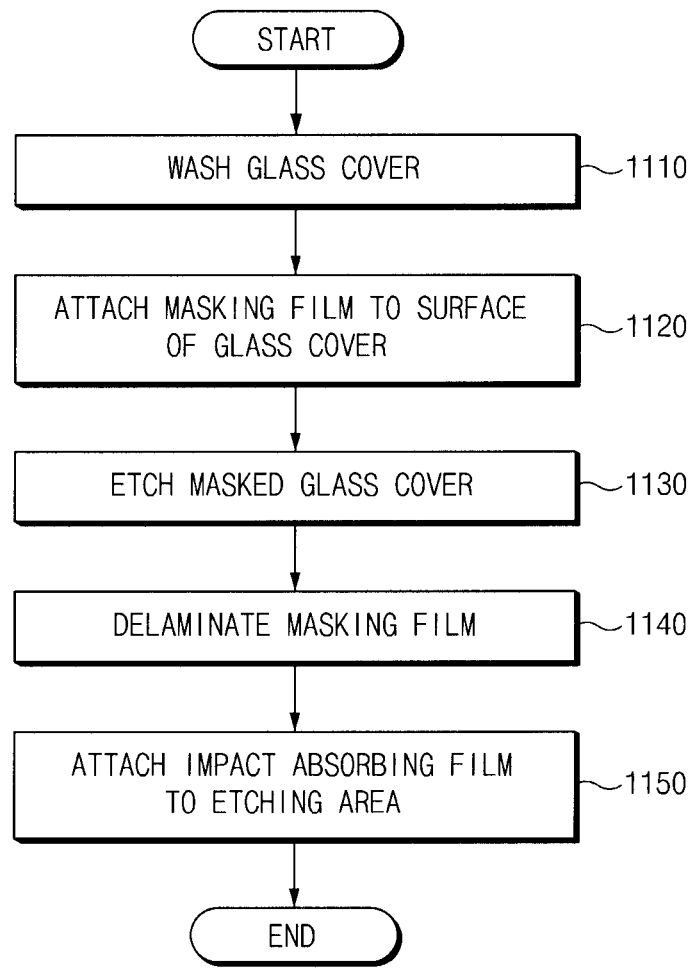
FIG. 11 is a flowchart of an example process of forming an impact absorber by using an impact absorbing film according to various embodiments.
Figure 12:
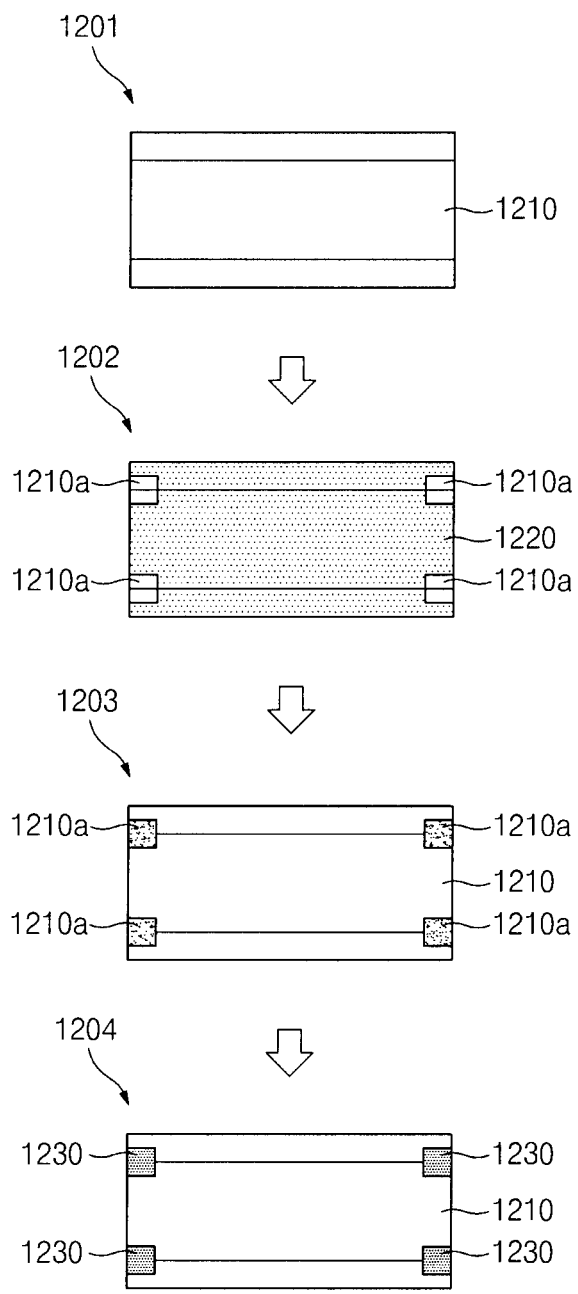
FIG. 12 is an example process view illustrating stages of the process outlined in FIG. 11.

FIG. 11 is a flowchart of a process of forming an impact absorber by using an impact absorbing film according to various embodiments. FIG. 12 is a process view showing example stages of such a process.

Referring to FIGS. 11 and 12, in operation 1110, the glass cover 1020 may be washed by using ultrasonic waves. The impurities on a surface of the glass cover 1020 may be removed through ultrasonic washing.

In operation 1120, a masking film 1220 may be attached to the surface of the glass cover 1210. The masking film 1220 may cover the remaining areas of the glass cover 1210 other than etching areas 1210a that is an area in which an impact absorber is formed. The masking film 1220 may prevent etching of the covered area. In various embodiments, the masking film 1220 may be attached by 3D curved surface dedicated equipment.

In operation 1130, a portion of the surface of the glass cover 1210 may be etched by an etching liquid. The area of the surface of the glass cover 1210, which is covered by the masking film 1220, may not be etched, and the areas (etching areas 1210a) that are not covered by the masking film 1220 may be etched by an etching liquid. The etching degree of the etching areas 1210a may be adjusted by adjusting the etching time.

In operation 1140, after the etching liquid is dried, the masking film 1220 may be delaminated. The surfaces of the etching areas 1210a of the glass cover 1210 may be partially etched, and an uneven surface may be formed.

In operation 1150, an impact absorbing film 1230 may be attached to the etching area 1210a. The impact absorbing film 1230 may be an impact alleviating transparent film corresponding to the etching thickness.

Figure 13:
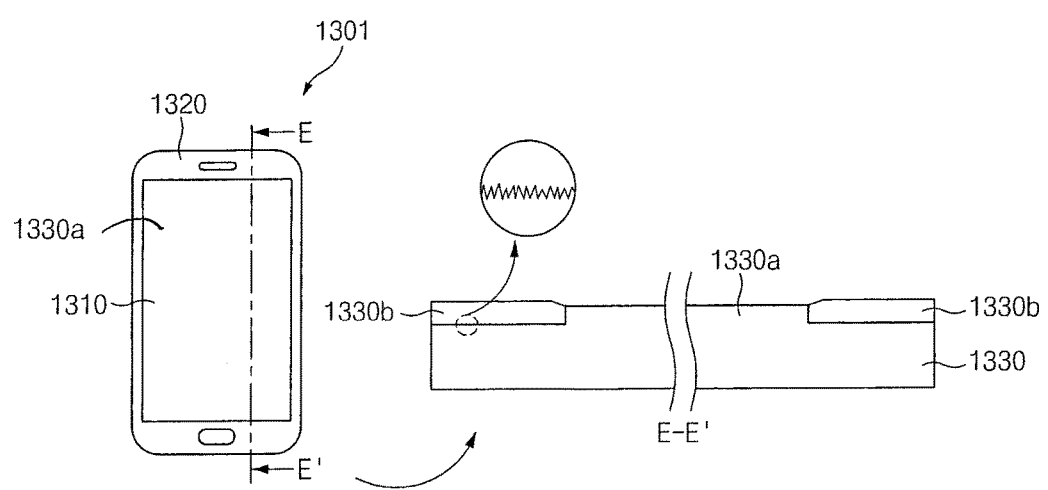
FIG. 13 is a perspective view and a sectional view of an electronic device in which an impact absorbing material is applied to a bezel area according to various embodiments.

FIG. 13 shows a perspective view of an electronic device, 1301, in which an impact absorbing material is applied to a bezel area according to various embodiments. A sectional view along the lines E-E' is also shown. The front surface area of the electronic device 1301 may be divided into a display view area 1330a of a glass cover 1330, and bezel areas 1320. Display view area 1330a may be an area above a display 1310 which outputs an image or a text. Bezel areas 1320 may be an area in which a wiring line for driving the display 1310 is disposed and may be opaquely processed.

According to various embodiments, in the glass cover 1330, impact absorbing areas 1330b may be formed by applying a resin to an area corresponding to the bezel area 1320. The impact absorbing areas 1330b may correspond to points adjacent corners of the electronic device 1301 similarly to the impact absorbers 1030 of FIG. 10, and may be expanded to areas other than the display view area 1330a.

The impact absorbing areas 1330b may decrease an area of the glass cover 1330 which collides with an external object (e.g. the ground when dropped on its front side. Further, the impact absorbing area 1330b may be distinguished from the display area 1310 such that the user may use the electronic device 1301 without any difficulty.

In various embodiments, the impact absorbing areas 1330b may be higher than the display view area 1330a when electronic device 1301 is oriented with its rear surface facing down. In this case, the possibility of the display view area 1330a directly colliding with an external object may be lowered. The impact absorbing areas 1330b may have an inclined structure in which the heights of the impact absorbing areas 1330b gradually increase with the increase of distance from the display view area 1330a.

In various embodiments, the impact absorbing areas 1330b may be applied by using a resin having a color instead of a transparent resin. The bezel area is generally processed by a black color, but the design characteristics of the bezel area may be emphasized when a separate color resin is applied.

According to various embodiments, the impact absorbing areas 1330b may be formed by using an ultraviolet curing resin. In this case, a silver screen printing method or a method using a roller may be used. Exemplary details on such operations are provided with reference to FIGS. 14 to 17.

Figure 14:
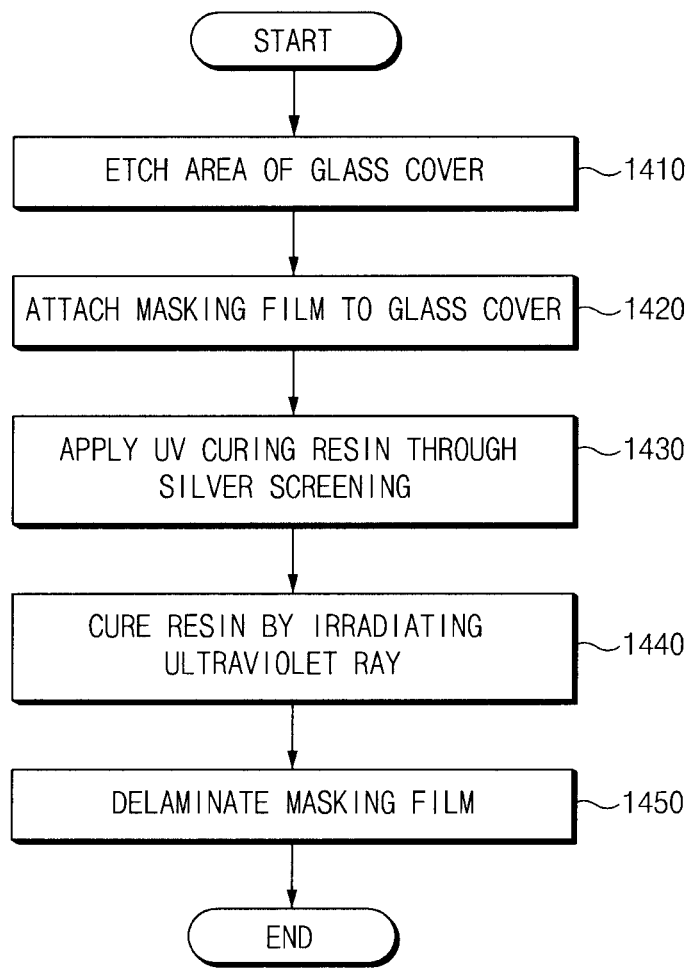
FIG. 14 is a flowchart of an example process of forming an impact absorbing area by a silver screen printing method.
Figure 15:
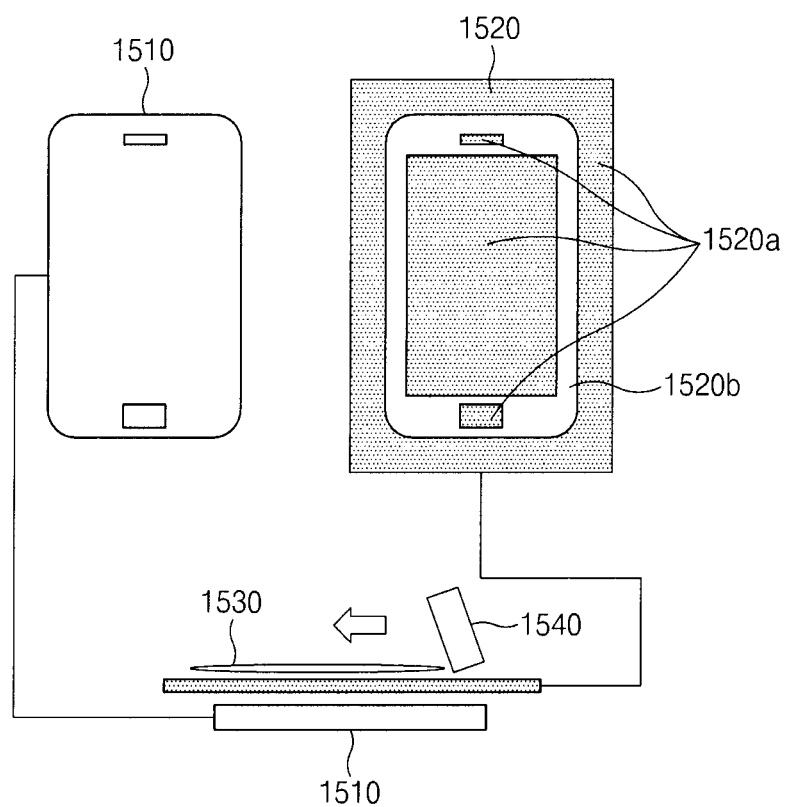
FIG. 15 is an example process view illustrating stages of the process outlined in FIG. 14.

FIGS. 14 and 15 are a flowchart and an exemplary process view, respectively, illustrating a process of forming an impact absorbing area by a silver screen printing method. In operation 1410, an area of a surface of the glass cover 1510, in which an impact absorbing area is to be formed, may be etched. The etched area may be an area that corresponds to the bezel areas around the display or is smaller than the bezel areas. The etching depth may be restricted to a range that does not influence the strength of the glass.

In operation 1420, a masking film 1520 may be attached to the glass cover 1510. The masking film 1520 may include masking areas 1520a in which a display area, a button, and a speaker are mounted, and an application area 1520b.

In operation 1430, an ultraviolet curing resin 1530 may be applied to the glass cover 1510 through silk screening. The ultraviolet curing resin 1530 may be applied to the application area 1520b other than the masking areas 1520a. The ultraviolet curing resin 1530 may be expanded through a print squeeze 1540. In operation 1440, the applied ultraviolet curing resin 1530 may be cured by an ultraviolet ray. The impact absorbing area may be formed on the surface of the glass cover 1510 corresponding to the application area 1520b. In operation 1450, a masking film 1520 may be delaminated from the surface of the glass cover 1510.

Figure 16:
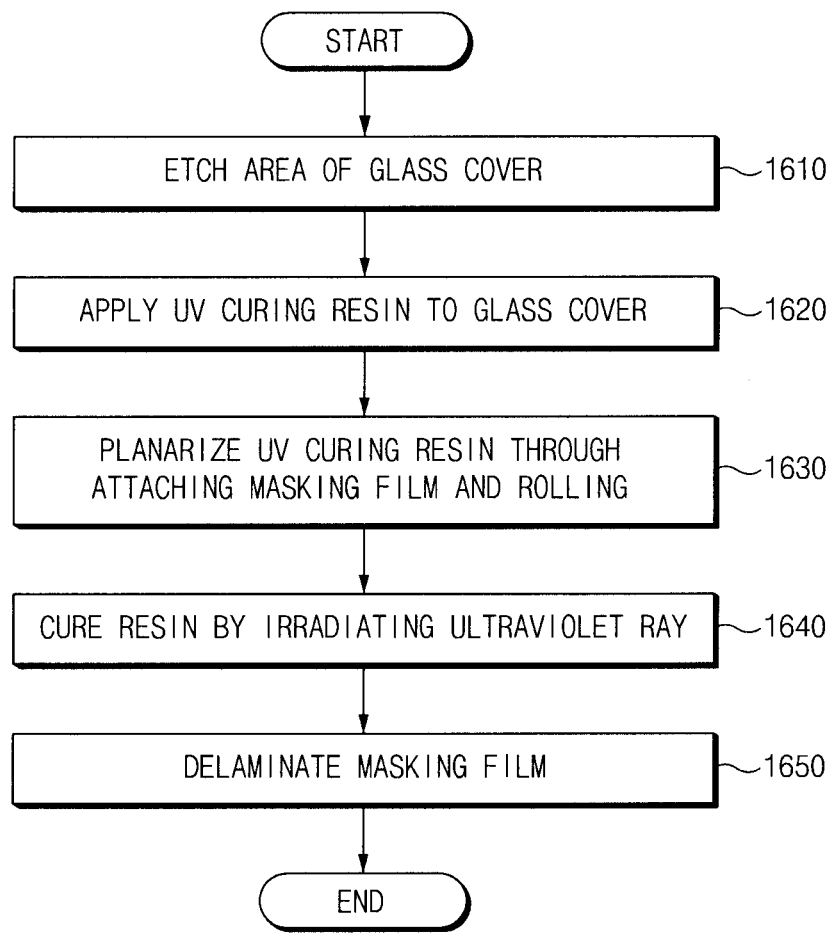
FIG. 16 is a flowchart of an example process of forming an impact absorbing area by using a roller.
Figure 17:
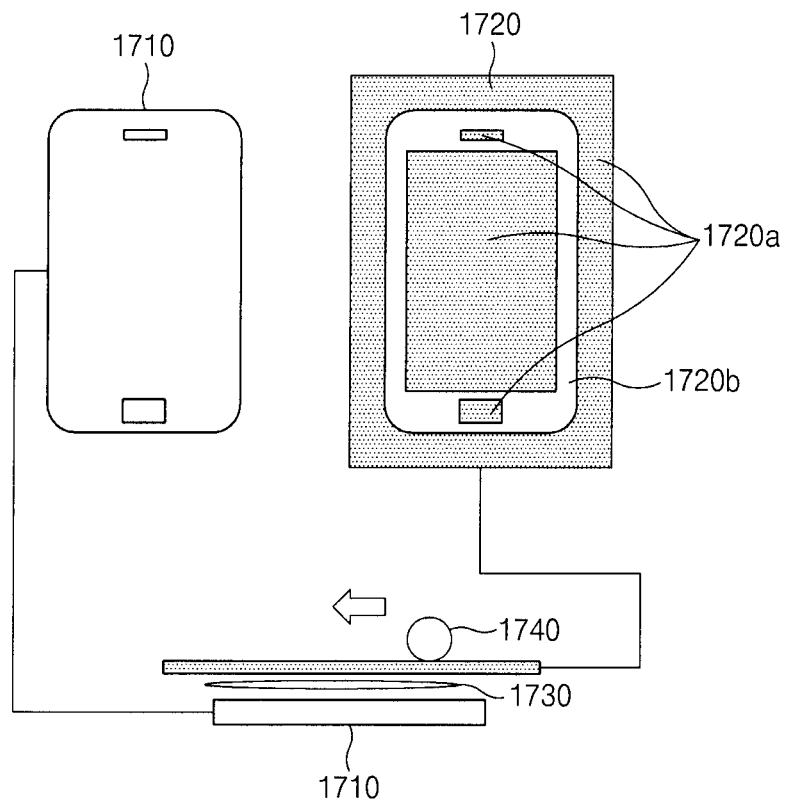
FIG. 17 is an example process view illustrating stages of the process outlined in FIG. 16.

FIG. 16 is a flowchart of an example process of forming an impact absorbing area by using a roller according to various embodiments. FIG. 17 is a process view of example stages in such a process.

Referring to FIGS. 16 and 17, in operation 1610, an area of the glass cover 1710, in which an impact absorbing area is to be formed, may be etched. The etched area may be an area that corresponds to the bezel areas around the display 1310 or is smaller than the bezel areas. In operation 1620, an ultraviolet curing resin 1730 may be applied to a surface of the glass cover 1710. Unlike the silk screen printing method of FIGS. 14 and 15, the ultraviolet curing resin 1730 may be directly applied to a surface of the glass cover 1710. In operation 1630, the masking film 1720 may cover the upper side of the ultraviolet curing resin 1730, and the ultraviolet curing rein 1730 may be planarized through a roller 1740. The masking film 1720 may include masking areas 1720a and an application area 1720b. In operation 1640, the applied ultraviolet curing resin 1730 may be cured by an ultraviolet ray. The impact absorbing area may be formed on the surface of the glass cover 1710 corresponding to the application area 1720b. In operation 1650, the masking film 1720 may be delaminated and the operation may be completed.

Figure 18:
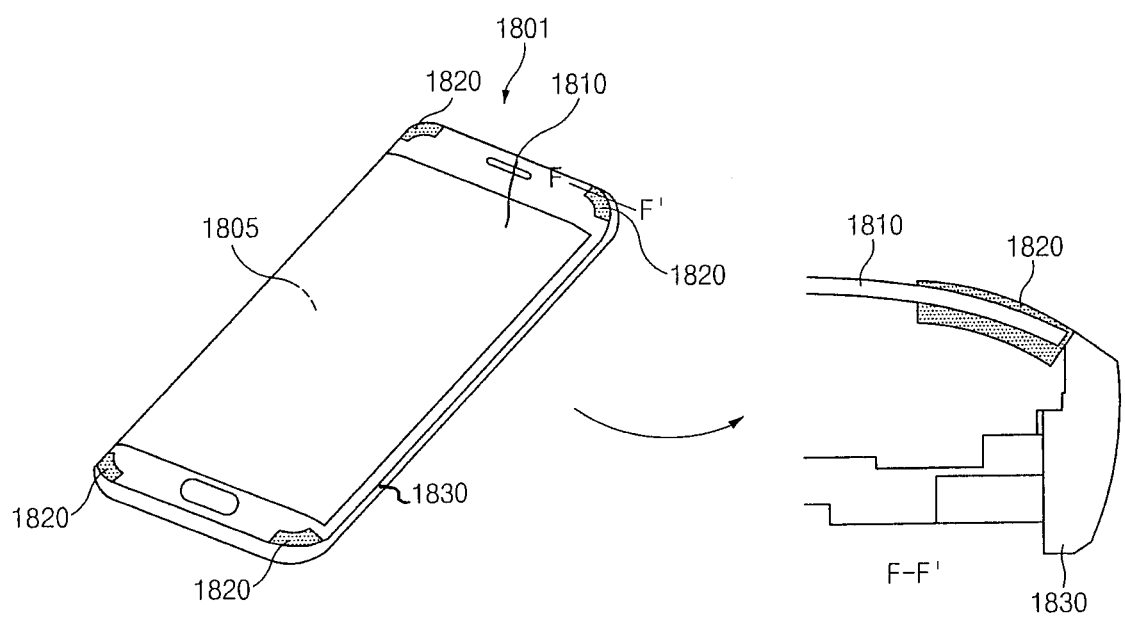
FIG. 18 illustrates a perspective view and a sectional view of an electronic device including an impact absorbing structure according to various embodiments.

FIG. 18 illustrates a perspective view of an electronic device, 1801, including an impact absorbing structure according to various embodiments. A cross-sectional view taken along the lines F-F' is also shown. Electronic device 1801 may include a display 1805, a glass cover 1810, impact absorbing structures 1820, and a housing frame 1830. At least a portion (for example, a corner area) of the glass cover 1810 may be protected by the impact absorbing structure 1820. When an impact is applied from the outside, the glass cover 1810 may not directly receive the impact but the impact (at a reduced level) may be indirectly transferred to the glass cover 1810 through the impact absorbing structures 1820.

The impact absorbing structures 1820 may be disposed between the glass cover 1810 and the housing frame 1830. The impact absorbing structures 1820 may be disposed adjacent to the corners of the electronic device 1801, to which the highest impact may be applied due to a fall or the like. Although FIG. 18 illustrates that the impact absorbing structures 1820 surround ends of the glass cover 1810, the present disclosure is not limited thereto. The impact absorbing structures 1820 may be implemented in various forms in consideration of manufacturing characteristics or design characteristics.

According to various embodiments, when the glass cover 1810 has a flat area and a curved area, the impact absorbing structures 1820 may be disposed at a junction between the flat area and the curved area, or at points adjacent to the junction. When the electronic device 1801 receives an impact due to a fall or the like, the housing frame 1830 or the impact absorbing structure 1820 may directly receive the impact, and the glass cover 1810 may indirectly receive a reduced impact through the housing frame 1830 or the impact absorbing structure 1820.

Figure 19:
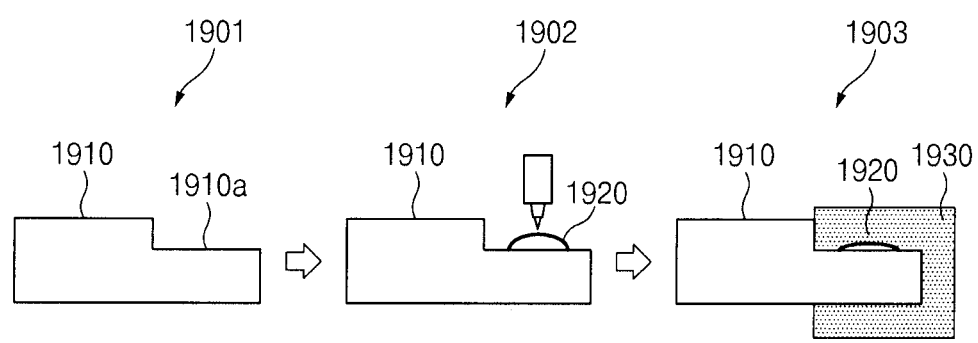
FIG. 19 is an exemplary process view illustrating an operation of forming an impact absorbing structure according to various embodiments.

FIG. 19 is an exemplary process view illustrating an operation of forming an impact absorbing structure according to various embodiments. In operation 1901, an area (hereinafter, an etching area 1910a) of the glass cover 1910 may be etched. The etching depth may be restricted to a range that does not influence the strength of the glass.

Thereafter, the glass cover 1910 may be seated in a mold for molding an impact absorbing structure.

In operation 1902, an adhesive 1920 may be applied to the etching area 1910*a*. The adhesive 1920 may reinforce coupling of the impact absorbing structure 1930, which will be formed later, and the glass cover 1910. In various embodiments, the adhesive 1920 may be a urethane based bond. In operation 1903, the impact absorbing structure 1930 may be injection-molded through direct molding in a mold. The impact absorbing structure 1930 may be implemented in a form that surrounds an end of the glass cover 1910. The impact absorbing structure 1930 may damp an external impact by preventing an end of the glass 1910 from directly contacting the housing frame.

Figure 20A:
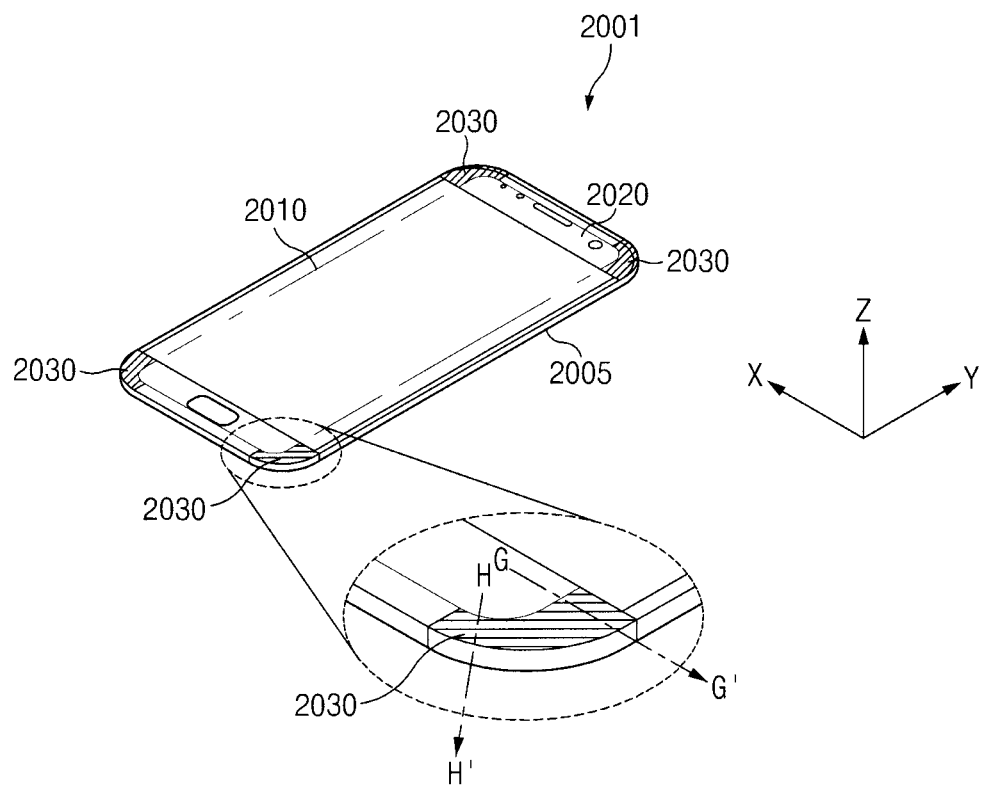
FIG. 20A and FIG. 20B are exemplary views of an electronic device including an impact absorber in the form of a 3-dimensional film according to various embodiments.
Figure 20B:
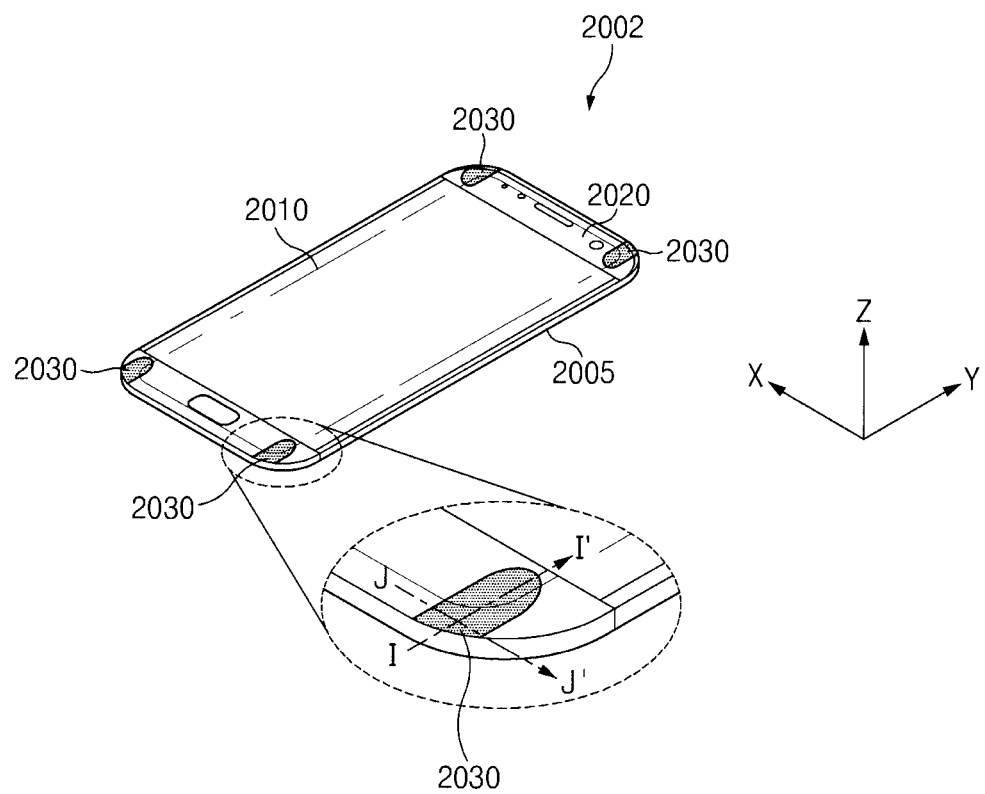

FIGS. 20A and 20B are perspective views of exemplary electronic devices, 2001 and 2002, each including an impact absorber in the form of a 3-dimensional film according to various embodiments.

Referring to FIGS. 20A and 20B, electronic devices 2001, 2002 may each include a housing frame 2005, a display 2010, and a glass over 2020. The functions or forms of the housing frame 2005 and the display 2010 may be the same or similar to the functions or forms of the housing frame 5 or 105 and the display 10 or 110 of FIGS. 1A and 1B. The glass cover 2020 may form at least a portion of the exterior surface of electronic device 2001 or 2002. In various embodiments, the glass cover 2020 may include a curved area at at least a portion thereof. For example, the glass cover 2020 may be flat in a display view area that transmits light output by the display 2010, and may have a convex curved surface in a bezel area around the display 2010.

According to various embodiments, the glass cover 2020 may have one or more impact absorbers 2030 attached thereto. The impact absorbers 2030 may be films in a 3-dimensional form that are attached to a surface of the glass cover 2020. According to another embodiment, the impact absorbers 2030 may be a coating layer form that is coated on a surface of the glass cover 2020.

For example, the impact absorbers 2230 may be formed of a material such as SiO2, SiON, SiN, Al2O3, AlON, AlN, ZnO, or SnO2. As another example, the impact absorber 2030 may be formed through a diamond like carbon (DLC) coating material (for example, ta-C, a-C:H, and ta-C:H).

In various embodiments, the structure of the impact absorbers 2030 may be a multilayered coating structure in which the above materials are combined, and the impact absorbers 2030 may single-layered film having a thickness of 10 nm or more. The properties of the impact absorbers 2030 may be implemented by a surface hardness of a coating layer of 5 GPa or more (measurement of nano-indentation). The impact absorbers 2030 may be curved to have a first curvature in a first direction (for example, direction G→G' or I→I') and may be curved to have a second curvature different from the first curvature in a second direction (for example, direction H→H' or J→J').

According to various embodiments, the glass cover 2020 may include a flat area mainly corresponding to the display view area and a curved area surrounding the flat area. According to various embodiments, when the flat area of the glass cover 2020 is disposed in the X-Y plane, the impact absorbers 2030 may be disposed in the curved area of the glass cover 2020 and may have an exterior surface with a curvature component in the Z direction. For example, the impact absorbers 2030 may have a first curvature (or a first curvature change rate) that is convex in an outward direction in G→G' or I→I', and may have a second curvature (or a second curvature change rate) that is convex outwards in H→H' or J→J'. The second curvature may be greater than the first curvature.

In various embodiments, the impact absorbers 2030 may be disposed at respective corners (or points adjacent to the corners of the electronic device 2001) of the rectangular glass cover 2020. In various embodiments, the impact absorbers 2030 may be disposed in areas corresponding to a junction between the flat area and the curved area of the glass cover 2020. The junction between the flat area and the curved area of glass cover 2020 may receive an external impact earlier than its other regions, and the impact absorbers 2030 may protect the glass cover 2020 from the external impact. In various embodiments, the impact absorbers 2030 may be disposed to cover an area of the glass cover 2020 in which a change in curvature is a specific value or more. For example, the impact absorbers 2030 may be mainly attached to areas in which the glass cover 2020 protrudes in a curved surface form that is convex. In the example of FIG. 20A, impact absorbers 2030 may each have a C-shape in a respective corner, while in FIG. 20B, impact absorbers 2030 may each have a "finger" shape.

Figure 21:
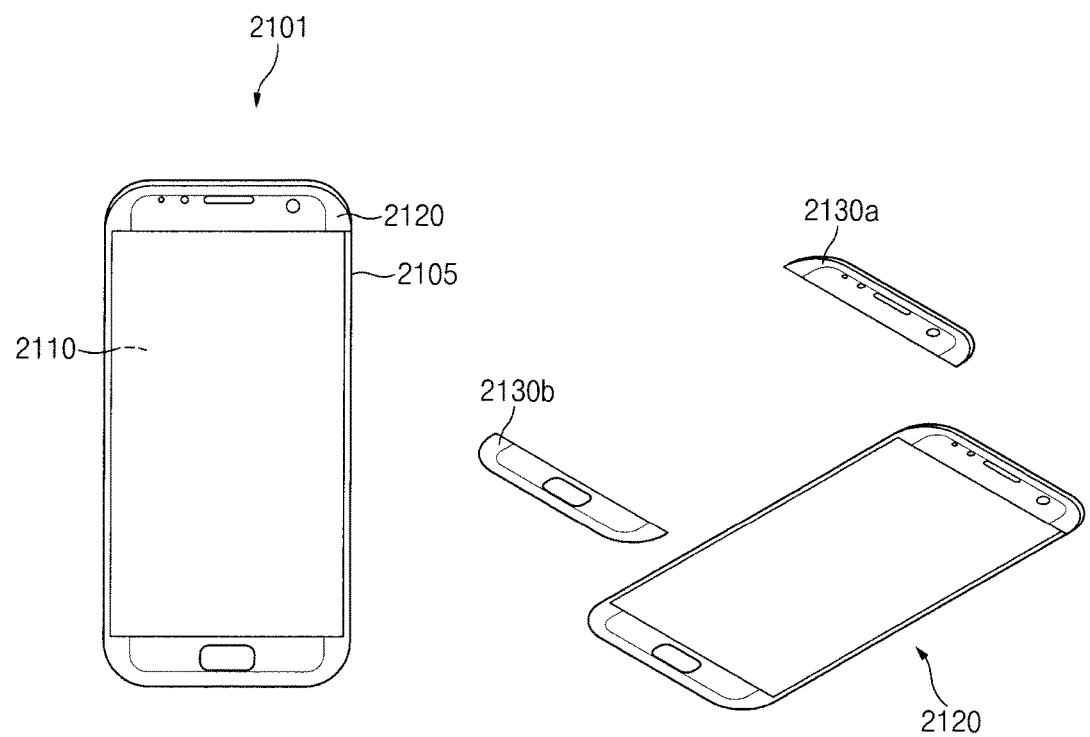
FIG. 21 illustrates a film that covers a peripheral area of a glass cover of an electronic device according to various embodiments.

FIG. 21 illustrates a film that covers a peripheral area of a glass cover of an electronic device according to various embodiments. An electronic device 2101 may include a housing frame 2105, a display 2110, and a glass cover 2120. The functions or forms of the housing 2105 and the display 2110 may be the same or similar to the functions or forms of the housing 5 or 105 and the display 10 or 110 of FIGS. 1A and 1B.

At least a portion of glass cover 2120 may include a curved area. The central area of the glass cover 2120 that coincides with the center of the display 2110 may be a flat area, while a peripheral area (for example, a lateral side "expansion area", a bezel area, and a button area of the display 2110) that surrounds the flat area may be a curved area. A first film 2130*a* and a second film 2130*b* that have 3-dimensional shapes may be attached to the curved area of the glass cover 2120. The first film 2130*a* and the second film 2130*b* may have holes for exposing a speaker or a button.

According to various embodiments, the first film 2130*a* and the second film 2130*b* may have a 3-dimensional form in which a first curvature in a first direction is different from a second curvature in a second direction. The first film 2130*a* and the second film 2130*b* may be stably attached to the curved area of the glass cover 2120 through the 3-dimensional shapes. In various embodiments, the first film 2130*a* may be disposed at an upper end of electronic device 2101, and the second film 2130*b* may be disposed at a lower end of the device 2101. The first film 2130*a* may damp an external impact that may be generated at a first corner and a second corner at the upper end of device 2101. The second film 2130*b* may damp an external impact that may be generated at a third corner and a fourth corner at the lower end of device 2101.

Figure 22A:
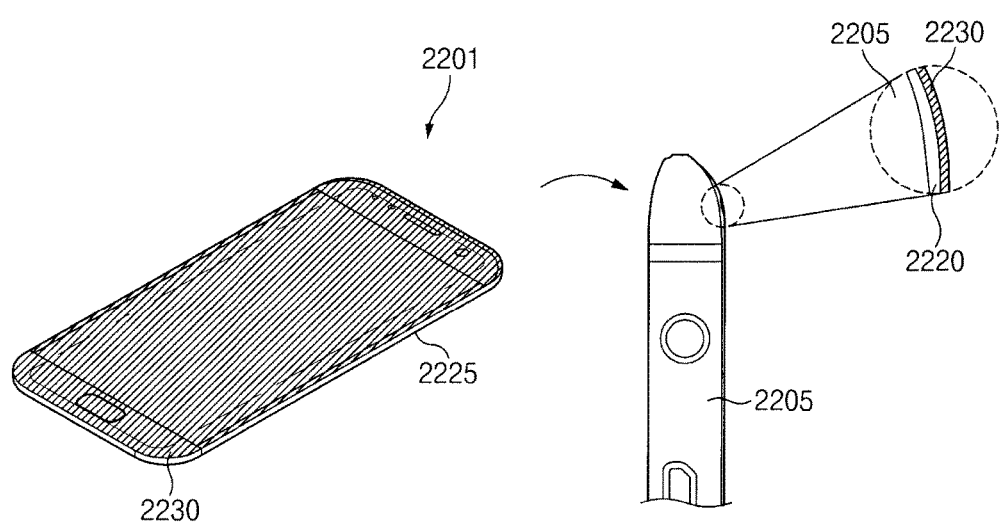
FIG. 22A illustrates an electronic device including a film that covers the entire area of a glass cover according to various embodiments.

FIG. 22A illustrates an electronic device, 2201, including a film that covers the entire area of a glass cover according to various embodiments. In the electronic device 2201, a film 2230 may be attached to the entire area of the glass cover 2220.

The glass cover 2220 may include a curved area (for example, a peripheral area of a front surface of the electronic device 2201) at at least a portion thereof. The area of the glass cover 2220 that is adjacent to the center of the display 2210 may be a flat area, while a peripheral area (for example, a side expansion area, a bezel area, a button area of the display 2210) may surround the flat area.

According to various embodiments, the film 2230 may have a form corresponding to the glass cover 2220. For example, the film 2230 may have a flat form in the flat area of the glass cover 2220, and may have a curved form in the curved area of the glass cover 2220. The film 2230 may include a hole for exposing a speaker or a button.

According to various embodiments, the film 2230 may have a form that includes a curved surface instead of a flat shape at at least a portion thereof. The film 2230 may be stably seated on the glass cover 2220 including a curved area at at least a portion thereof. The film 2230 may primarily absorb an impact from an external object, and may damp the impact applied to the glass cover 2220.

Figure 22B:
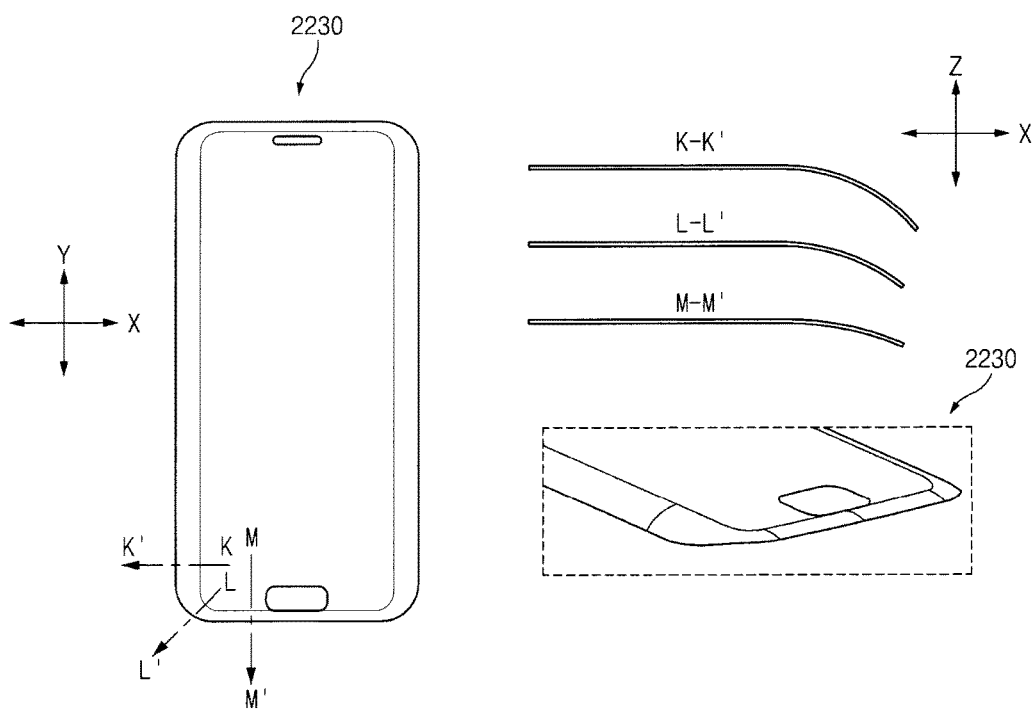
FIG. 22B and FIG. 22C illustrate a film that covers the entire area of a glass cover according to various embodiments.
Figure 22C:
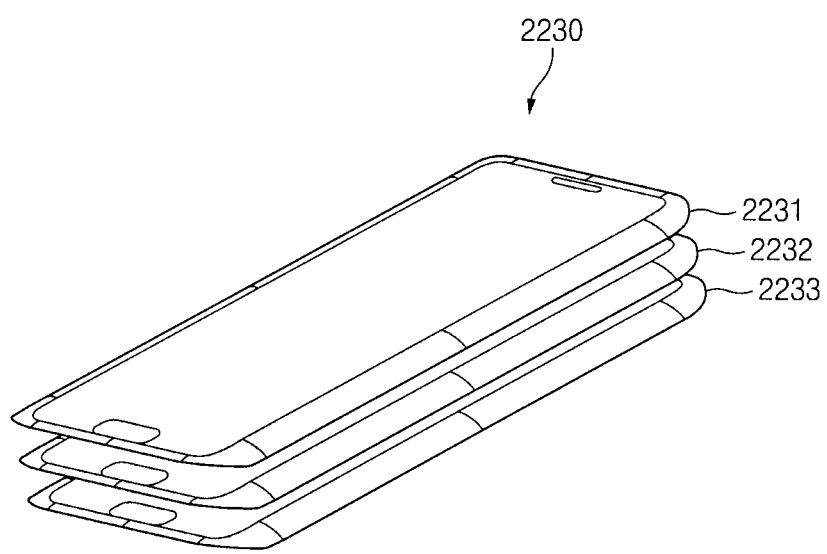

FIGS. 22B and 22C illustrate a film, 2230, that covers the entire area of a glass cover of an electronic device according to various embodiments. Film 2230 may be attached to the entire area of the glass cover. The film 2230 may include a hole for exposing a speaker or a button. The film 2230 may have a form corresponding to a surface of the glass cover. The film 2230 may have a flat form at a central portion thereof, and may have a curved form in a peripheral area thereof. For example, the film 2230 may be curved at a first curvature in direction K-K' (for example, a direction that faces the right side from the center thereof), and may be curved at a second curvature in direction L-L' (for example, a direction that faces from the center to a corner thereof). The film 2230 may be curved at a third curvature in direction M-M' (for example, a direction that faces from the center to a lower end thereof). The first to third curvature may be different values.

Referring to FIG. 22C, the film 2230 may include a coating layer 2231, a film layer 2232, and a bonding layer 2233. The coating layer 2231 may be a protective layer for preventing surface scratched by an external object. The film layer 2232 may be a PET layer for fixing the shape of the film 2230. The bonding layer 2233 may be a layer for fixing the film 2230 to the glass cover 2220. FIGS. 22B and 22C are exemplary and the present disclosure is not limited thereto.

According to various embodiments, the film 2230 may include only the coating layer 2231 without the bonding layer 2233 and the film layer 2232 (not illustrated). The coating layer 2231 may be formed of a material such as $SiO_2$, $SiON$, $SiN$, $Al_2O_3$, $AlON$, $AlN$, $ZnO$, or $SnO_2$. As another example, the coating layer 2231 may be formed through a diamond like carbon (DLC) coating material (for example, ta-C, a-C:H, and ta-C:H).

In various embodiments, the structure of the coating layer 2231 may be a multilayered coating structure in which the above materials are combined, and the coating layer 2231 may be single-layered film having a thickness of 10 nm or more. The properties of the coating layer 2231 may be implemented by a surface hardness of the coating layer 2231 of 5 GPa or more (measurement of nano-indentation).

The coating layer 2231 may maintain a visual ray transmission rate of a specific value or more such that a visual ray (400 nm to 700 nm) of a display that transmits the glass cover 2220 to be output may be transferred to the user. For example, the coating layer 2231 may be implemented to maintain an average visual ray transmission rate of 85% or more when being coated on the glass cover 2220. According to various embodiments, the coating layer 2231 may maintain a color of a specific value or lower after being coated on the glass cover 2220, to implement a color of the display. For example, the coating layer 2231 may maintain color values, including CIE, L*, a*, and b*, of $-4<a^*<4$ and $-4<b^*<4$ after the glass cover 2220 is coated (L* denotes lightness, a* denotes a stronger red color as the value becomes greater and a stronger green color as the value becomes smaller, and b* denotes a stronger yellow color as the value becomes greater and a stronger blue color as the value becomes smaller).

Figure 23A:
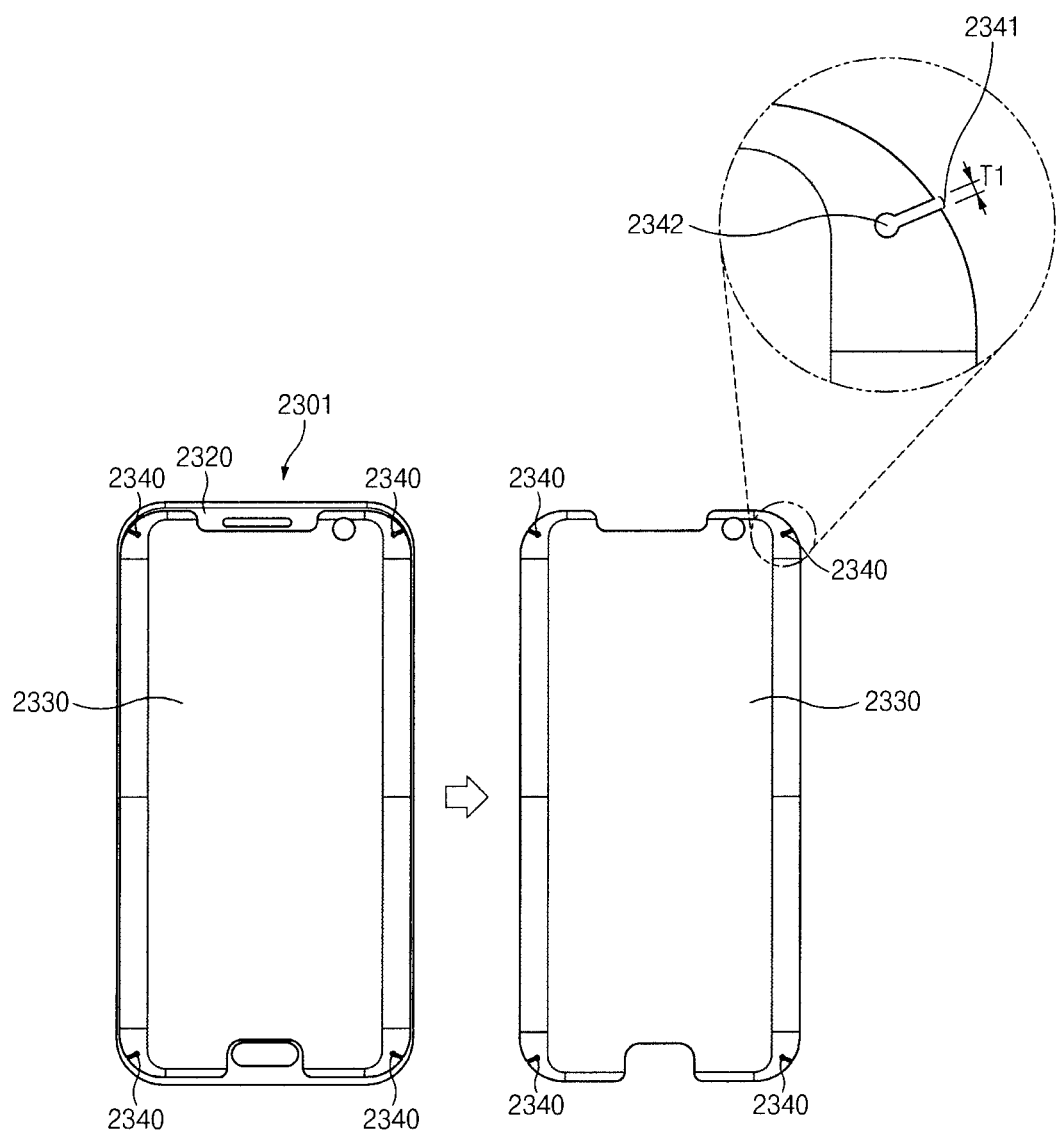
FIG. 23A illustrates a film having a slit according to various embodiments.

FIG. 23A illustrates a film 2330 having a slit, to cover a glass cover of an electronic device according to various embodiments. Film 2330 may be attached to a glass cover 2320. The film 2330 may include a curved area (for example, a peripheral area of a front surface of an electronic device 2301) at at least a portion thereof. For example, an area of the film 2330 that is adjacent to the center of the display may be a flat area, and a peripheral area (for example, a side expansion area, a bezel area, a button area of the display) that surrounds the flat area may be a curved area.

In various embodiments, the film 2330 may have a solid form (or a 3D form) corresponding to the glass cover 2320. For example, the film 2330 may have a flat form in the flat area of the glass cover 2320, and may have a curved form in the curved area of the glass cover 2320. The film 2330 may include a hole or an opening for exposing a speaker or a button. The film 2330 may primarily absorb an impact from an external object, and may alleviate the impact applied to the glass cover 2320.

The film 2330 may include at least one slit 2340 at a corner portion (or a portion of the glass cover 2320 having the largest curvature) of the electronic device 2301. The slit 2340 may prevent generation of bubbles that may be generated in a process of mounting the film 2330 on the glass cover 2320. The arrangement direction of the slit 2340 may be a diagonal direction that faces a corner of the electronic device 2301. For example, the slit 2340 may be disposed from a point having the largest curvature of the glass cover 2320 in a direction that faces a corner of the electronic device 2301.

According to various embodiments, the slit 2340 may include a first distal end 2341 that faces an outward direction of the electronic device 2301 along the diagonal direction thereof and a second distal end 2342 that faces an inward direction of the electronic device 2301. The first distal end 2341 may be opened, and the second distal end 2342 may be closed (not opened) unlike the first distal end 2341. The width T1 of the slit 2340 between the first distal end 2341 and the second distal end 2342 may be constant (for example, 0.41 mm) during the process of manufacturing the film 2330, and may be widened or narrowed according to the curved form of the glass cover 2320 after the film 2330 is attached to the electronic device 2301. For example, the width T1 may become gradually smaller from the first distal end 2341 towards the second distal end 2342 after the film 2330 is attached to the electronic device 2301. For example, the width T1 may become gradually larger from the first distal end 2341 towards the second distal end 2342 after the film 2330 is attached to the electronic device 2301.

According to various embodiments, the second distal end 2342 may have a space that is larger than the width T1 of the slit 2340. According to various embodiments, the second distal end 2342 may have a circular (or elliptical) shape. When the second distal end 2342 has a circular (or elliptical) shape, a force (stress) applied to the second distal end 2342 in the process of attaching the film 2330 to the glass cover 2320 may be uniformly dispersed so that a phenomenon in which the film 2330 is torn or popped out may be prevented.

According to various embodiments, the film 2330 may include an opening extending from the outside towards the inner side of the electronic device 2301, from which an area is removed, at a corner (or a portion of the glass cover 2320 having the largest curvature) of the electronic device 2301. In various embodiments, the opening may have a slit shape in a first range and a circular (or elliptical) shape in a second range, from the outside toward the inner side of the electronic device 2301.

Figure 23B:
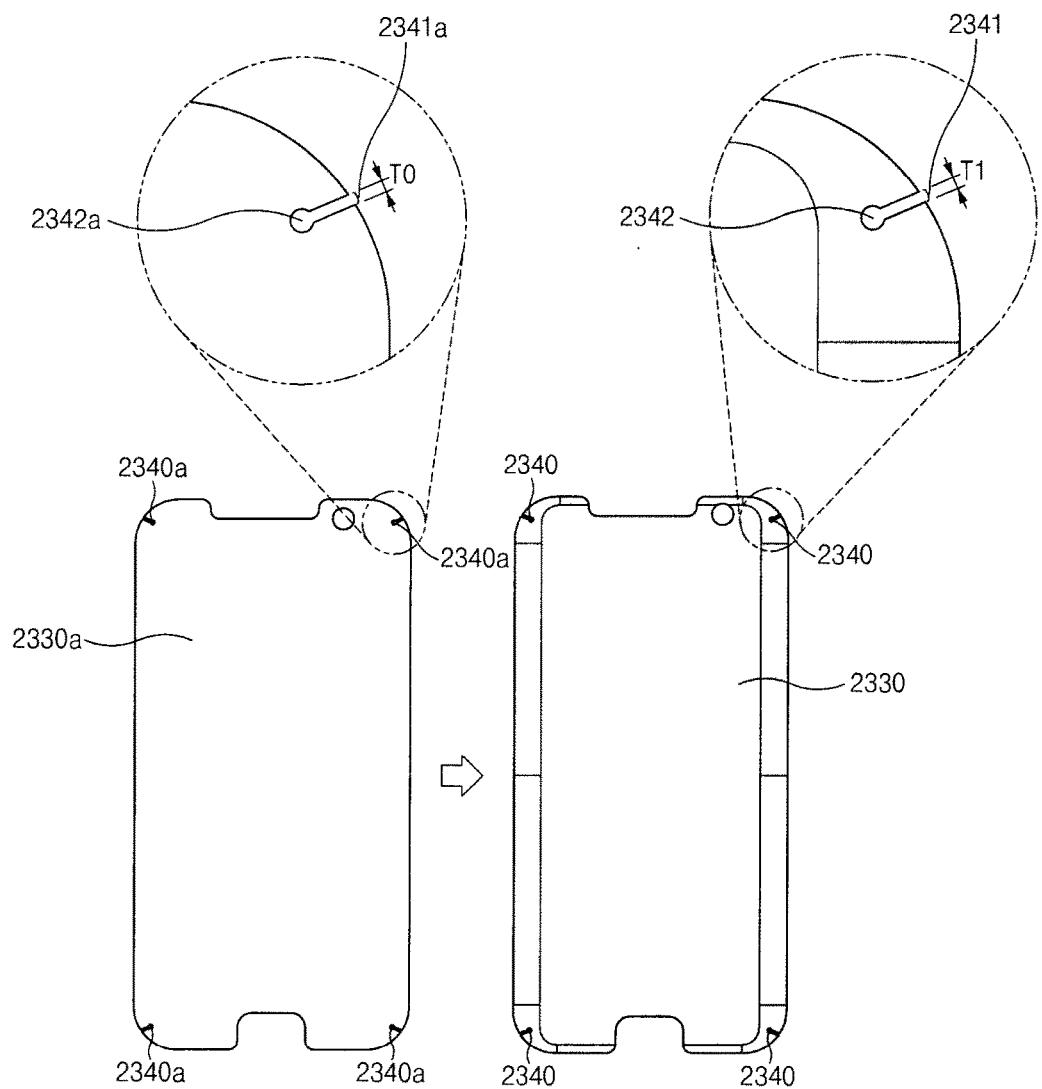
FIG. 23B illustrates a process of manufacturing a film having a slit according to various embodiments.

FIG. 23B illustrates a process of manufacturing a film having a slit according to various embodiments. However, FIG. 23 is exemplary and the present disclosure is not limited thereto.

Referring to FIG. 23B, the film 2330a before forming may be flat. The outer shape of the film 2330a before forming may be determined in consideration of arrangement locations of a button, a camera lens, a sensor, and the like disposed in the electronic device 2301. In various embodiments, the film 2330a before forming may include a pressure sensitive adhesive (PSA) lamination.

According to various embodiments, the film 2330a before forming may include a slit 2340a. The slit 2340a may have a constant width T0, and may include a first distal end 2341a and a second distal end 2342a. The second distal end 2342a may have a circular space, the width of which is larger than the width T0. The film 2330 after forming may be formed to have a 3D solid shape by applying heat or pressure to the film 2330a before forming. The film 2330 after forming may have a solid form (or a 3D form) corresponding to the glass cover 2320. The film 2330 after forming may have a flat form at a central portion thereof, and may have a curved form in a peripheral area thereof. The film 2330 after forming may include a slit 2340. The width T1 of the slit 2340 may be equal to or greater than the width T0 of the slit 2340a before forming. For example, the width T1 may become gradually smaller from the first distal end 2341 towards the second distal end 2342.

In accordance with an aspect of the present disclosure, there is provided an electronic device including a housing including a first surface facing a first direction and a second surface facing a second direction opposite to the first direction, a display exposed through the first surface or the second surface of the housing, and a glass cover forming at least a portion of the first surface of the housing, wherein at least a portion of the glass cover has a protrusion protruding in the first direction.

According to various embodiments, the electronic device may further include a structure forming a portion of the housing while surrounding at least a portion of an area between the first surface and the second surface of the housing, and the protrusion protrudes further than the structure in the first direction.

According to various embodiments, the protrusion may be formed in an area adjacent to the structure and may be formed of the same material as that of the glass cover or at least partially contains a second material. A hardness of the second material may be the same as or lower than a hardness of the material of the glass cover. The structure may include a bezel area around the display.

According to various embodiments, the glass cover may include a peripheral area forming a deflected surface. The protrusion may be disposed at least partially in the peripheral area. The glass cover may include a first area corresponding to an active area in which a screen is displayed on the display and a second area surrounding the first area and the protrusion may be disposed at at least a portion of the second area.

According to various embodiments, the protrusion may be formed through at least one hole passing through the glass cover. For example, the protrusion may be formed by filling a portion of the housing in the hole. As another example, the protrusion may be formed by filling a separate material attached to the housing in the hole.

In accordance with another aspect of the present disclosure, there is provided an electronic device including a display, a housing on which the display is mounted, and a glass cover covering the display and mounted on the housing, wherein the glass cover includes at least one impact absorber attached on a surface thereof, and the impact absorber covers the display or at least a portion of a peripheral area adjacent to the display. According to various embodiments, the impact absorber may be implemented by a film having a 3-dimensional shape in which a first curvature is provided in a first direction and a second curvature is provided in a second direction.

According to various embodiments, the impact absorber may include at least one slit that has a first distal end opened towards the outside of the electronic device and a second distal end that faces an inward direction, and the second distal end may have a circular shape, a diameter of which is larger than the width of the slit. According to various embodiments, the impact absorber includes a first part covering a portion of the peripheral area of the glass cover and a second part covering another portion of the peripheral area of the glass cover. The impact absorber may cover an area of the glass cover in which a change in curvature is equal to or greater than a specific value. The impact absorber may have the same form as the form of the glass cover in the first direction.

According to various embodiments, the glass cover may include a flat area and at least one curved area extending from the flat area, and the at least one impact absorber may be disposed at a border between the flat area and the curved area. The impact absorber may be attached to an area in which a surface of the glass cover is partially removed. According to various embodiments, the impact absorber may has the same height as that of a surface of the glass cover or may protrude further than the surface of the glass cover. When the impact absorber protrudes further than the surface of the glass cover, its height may become gradually higher as it become more distant from the display in a specific range. According to various embodiments, the impact absorber may be provided through an impact absorbing film attached to an etched area of a surface of the glass cover. The impact absorber may be formed through a resin applied to a bezel area around the display.

According to various embodiments, the impact absorber may be formed of at least one material of SiO2, SiON, SiN, Al2O3, AlON, AlN, ZnO, or SnO2. or may be coated by a diamond like carbon (DLC) coating-based material (for example, ta-C, a-C:H, or ta-C:H). The impact absorber may be implemented by single-layered or multilayered coating and the surface hardness of the coating layer may be 5 GPa or higher.

In accordance with another aspect of the present disclosure, there is provided an electronic device including a display, a glass cover that covers the display, an outer housing on which the glass cover is mounted, and an impact absorbing structure disposed between at least a portion of an end of the glass cover and the outer housing. The impact absorbing structure may be bonded to an etched end of the glass cover and may surround the glass cover.

According to various embodiments, the glass cover may include a flat area and at least one curved area extending from the flat area, and at least one impact absorbing structure may be disposed at a border of the flat area and the curved area. The impact absorbing structure may be disposed adjacent to a corner of the outer housing. The impact absorbing structure may be formed through injection-molding.

Each of the elements described in the specification may include one or more components, and the terms of the elements may be changed according to the type of the electronic device. In various embodiments of the present disclosure, the electronic device may include at least one of the elements described in the specification, and some elements may be omitted or additional elements may be further included. Some of the elements of the electronic device according to various embodiments may be coupled to form one entity, and may perform the same functions of the corresponding elements before they are coupled. Further, the embodiments disclosed in the specification are provided to describe the technical contents or for understanding of the technical contents, and the technical scope of the present disclosure is not limited thereto. Accordingly, the scope of the present disclosure should be construed to include all changes or various embodiments based on the technical spirit of the present disclosure.

The electronic device according to various embodiments of the present disclosure may prevent a glass cover from being broken by an external impact by employing a protrusion on a surface of the glass cover.

The electronic device according to various embodiments of the present disclosure may protect a glass cover from an external impact while maintaining a design unity, by removing a portion of the glass cover and attaching an impact absorbing material. The electronic device according to various embodiments of the present disclosure may prevent a glass cover being broken by an external impact by employing a protrusion formed through a hole of the glass cover.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a display;
   a housing frame on which the display is mounted; and
   a glass cover covering the display and mounted on the housing frame,
   wherein the glass cover comprises at least one impact absorber attached on a surface thereof, the impact absorber covering a region of the glass cover coinciding with the display or at least a portion of a peripheral area of the glass cover adjacent to the display;
   wherein the impact absorber is implemented by having a 3-dimensional shape with a first curvature and a second curvature, and
   wherein the impact absorber comprises at least one slit that has a first distal end opened towards the outside of the electronic device and a second distal end that faces an inward direction.

2. The electronic device of claim 1, wherein the impact absorber comprises a first part covering a portion of the peripheral area of the glass cover and a second part covering another portion of the peripheral area of the glass cover.

3. The electronic device of claim 1, wherein the impact absorber covers an area of the glass cover in which a change in curvature is equal to or greater than a specific value.

4. The electronic device of claim 1, wherein the glass cover comprises a flat area and at least one curved area extending from the flat area, and the at least one impact absorber is disposed at a junction between the flat area and the curved area.

5. The electronic device of claim 1, wherein the impact absorber is attached to an area in which a surface of the glass cover is partially removed.

6. The electronic device of claim 1, wherein the impact absorber is provided through an impact absorbing film attached to an etched area of a surface of the glass cover.

7. The electronic device of claim 1, wherein the impact absorber is formed through a resin applied to a bezel area around the display.

8. The electronic device of claim 1, wherein the impact absorber is formed of at least one material of $SiO_2$, $SiON$, $SiN$, $Al_2O_3$, $AlON$, $AlN$, $ZnO$, and $SnO_2$.

9. The electronic device of claim 1, wherein the impact absorber is coated by a diamond like carbon (DLC) coating-based material.

* * * * *